United States Patent
Chen et al.

(10) Patent No.: US 10,879,214 B2
(45) Date of Patent: Dec. 29, 2020

(54) DIE STACK STRUCTURE AND METHOD OF FABRICATING THE SAME

(71) Applicant: Taiwan Semiconductor Manufacturing Co., Ltd., Hsinchu (TW)

(72) Inventors: Yi-Hsiu Chen, Hsinchu (TW); Wen-Chih Chiou, Miaoli County (TW); Yung-Lung Chen, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/874,899

(22) Filed: Jan. 19, 2018

(65) Prior Publication Data

US 2019/0131276 A1    May 2, 2019

Related U.S. Application Data

(60) Provisional application No. 62/579,901, filed on Nov. 1, 2017.

(51) Int. Cl.
  *H01L 25/065* (2006.01)
  *H01L 23/48* (2006.01)
  (Continued)

(52) U.S. Cl.
  CPC ...... *H01L 25/0657* (2013.01); *H01L 21/6835* (2013.01); *H01L 23/3128* (2013.01); *H01L 23/481* (2013.01); *H01L 23/544* (2013.01); *H01L 24/03* (2013.01); *H01L 24/05* (2013.01); *H01L 24/06* (2013.01); *H01L 24/08* (2013.01); *H01L 24/80* (2013.01); *H01L 2221/6834* (2013.01); *H01L 2221/68309* (2013.01); *H01L 2221/68318* (2013.01); *H01L 2221/68327* (2013.01); *H01L 2221/68381* (2013.01); *H01L 2223/54426* (2013.01);
  (Continued)

(58) Field of Classification Search
  CPC ............ H01L 21/2007; H01L 25/0657; H01L 21/76251; H01L 21/76254; H01L 24/02; H01L 24/80; H01L 24/08; H01L 24/06; H01L 24/05; H01L 23/481; H01L 2225/06541; H01L 2224/08146
  See application file for complete search history.

(56) References Cited

U.S. PATENT DOCUMENTS 6,853,067 B1 * 2/2005 Cohn ................. B81C 1/00238
                                                                  257/704
8,802,504 B1   8/2014 Hou et al.
(Continued)

*Primary Examiner* — Thanh Y. Tran
(74) *Attorney, Agent, or Firm* — JCIPRNET

(57) ABSTRACT

Provided is a die stack structure including a first die, a second die, a first bonding structure, and a second bonding structure. The first bonding structure is disposed on a back side of the first die. The second bonding structure is disposed on a front side of the second die. The first die and the second die are bonded together via the first bonding structure and the second bonding structure and a bondable topography variation of a surface of the first bonding structure bonding with the second bonding structure is less than less than 1 μm per 1 mm range. A method of manufacturing the die stack structure is also provided.

19 Claims, 22 Drawing Sheets

(51) Int. Cl.
*H01L 23/00* (2006.01)
*H01L 21/683* (2006.01)
*H01L 23/544* (2006.01)
*H01L 23/31* (2006.01)

(52) U.S. Cl.
CPC ............... *H01L 2224/0225* (2013.01); *H01L 2224/03002* (2013.01); *H01L 2224/05006* (2013.01); *H01L 2224/05025* (2013.01); *H01L 2224/0601* (2013.01); *H01L 2224/06181* (2013.01); *H01L 2224/08145* (2013.01); *H01L 2224/08146* (2013.01); *H01L 2224/13101* (2013.01); *H01L 2224/13144* (2013.01); *H01L 2224/13147* (2013.01); *H01L 2224/80203* (2013.01); *H01L 2224/80895* (2013.01); *H01L 2224/80896* (2013.01); *H01L 2225/06541* (2013.01); *H01L 2225/06596* (2013.01); *H01L 2924/1203* (2013.01); *H01L 2924/1304* (2013.01); *H01L 2924/141* (2013.01); *H01L 2924/1433* (2013.01); *H01L 2924/1434* (2013.01); *H01L 2924/1436* (2013.01)

(56) References Cited

U.S. PATENT DOCUMENTS

| | | |
|---|---|---|
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2008/0142990 A1* | 6/2008 | Yu ............... H01L 21/76898 257/777 |
| 2012/0018871 A1* | 1/2012 | Lee ............... H01L 24/97 257/698 |
| 2012/0018876 A1* | 1/2012 | Wu ............... H01L 24/14 257/737 |
| 2012/0032348 A1* | 2/2012 | Yu ............... H01L 25/0657 257/777 |
| 2013/0309813 A1* | 11/2013 | Shih ............... H05K 3/4007 438/118 |
| 2015/0021784 A1* | 1/2015 | Lin ............... H01L 23/481 257/774 |
| 2015/0318246 A1* | 11/2015 | Yu ............... H01L 23/00 257/774 |
| 2017/0053844 A1* | 2/2017 | Tsai ............... H01L 24/80 |
| 2018/0005992 A1* | 1/2018 | Yu ............... H01L 24/20 |
| 2018/0323133 A1* | 11/2018 | Kirby ............... H01L 23/481 |
| 2019/0189562 A9* | 6/2019 | Yu ............... H01L 23/5226 |

* cited by examiner

DIE STACK STRUCTURE AND METHOD OF FABRICATING THE SAME

CROSS-REFERENCE TO RELATED APPLICATION

This application claims the priority benefit of U.S. provisional application Ser. No. 62/579,901, filed on Nov. 1, 2017. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Exemplary types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
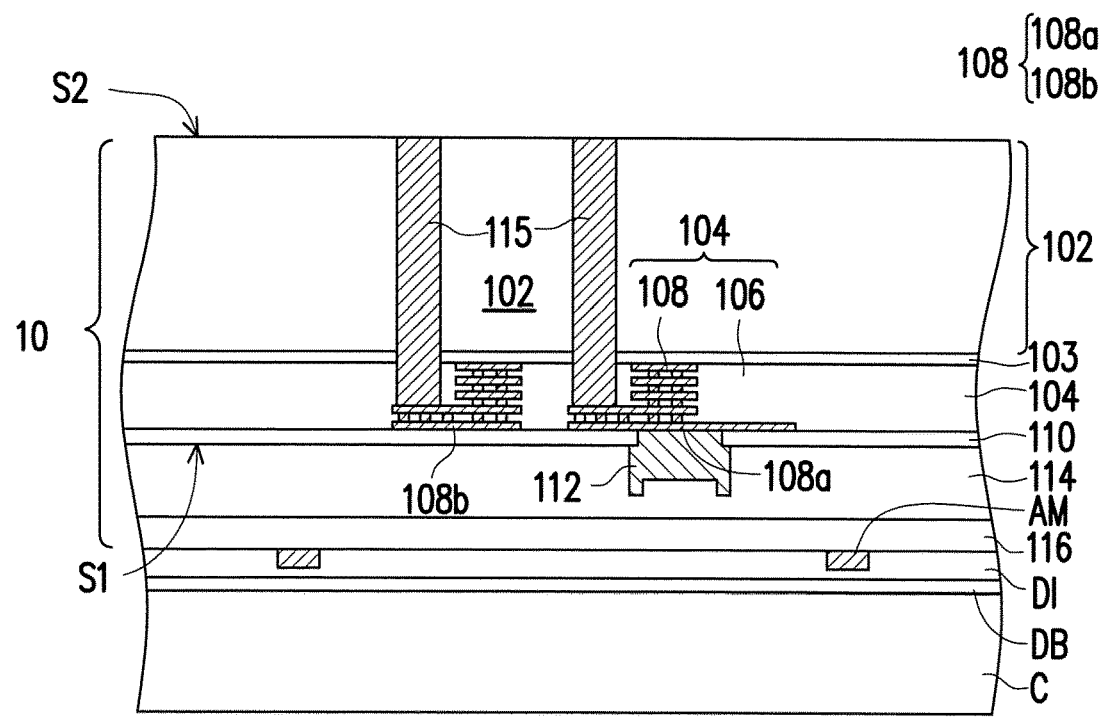
FIG. 1A to FIG. 1G are cross-sectional views of a method of forming a die stack structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views of a method of forming a die stack structure in accordance with a first embodiment.

Referring to FIG. 1A, a carrier C having a de-bonding layer DB and a dielectric layer DI formed thereon is provided, wherein the de-bonding layer DB is formed between the carrier C and the dielectric layer DI. In some embodiments, the carrier C is a glass substrate, a silicon substrate, or any suitable carrier for the manufacturing process of the package, the de-bonding layer DB is a light-to-heat conversion (LTHC) release layer formed on the glass substrate, and the dielectric layer DI is a photosensitive polybenzoxazole (PBO) layer formed on the de-bonding layer DB. In alternative embodiments, the de-bonding layer DB may be a photo-curable release film whose stickiness is decreased by a photo-curing process or a thermal curable release film whose stickiness is decreased by a thermal-curing process, and the dielectric layer DI may be made of other photosensitive or non-photosensitive dielectric materials. In some embodiments, the dielectric layer DI may be a polybenzoxazole (PBO) layer, a polyimide (PI) layer or other suitable dielectric layers. In some alternative embodiments, the de-bonding layer DB may be a dielectric layer different from the dielectric layer DI.

Referring to FIG. 1A, a plurality of alignment marks AM are formed in the dielectric layer DI and are exposed by the dielectric layer DI. In some embodiments, the alignment marks AM may be used for aligning the carrier C with the to-be-formed isolation structures 118 during a photolithography process to mount the wafer 10 over the carrier C. In some embodiments, the alignment marks AM may include metal, such as copper, copper alloys, aluminum, aluminum alloys, or combinations thereof. The alignment marks AM may be formed by electro-chemical plating process, PVD or the like.

Referring to FIG. 1A, a wafer 10 is mounted over the carrier C. In some embodiments, the wafer 10 includes a front side S1 and a back side S2 opposite to each other. The front side S1 of the wafer 10 faces toward the carrier C, while the back side S2 of the wafer 10 faces upward. In some embodiments, the front side S1 of the wafer 10 is an active surface. In detail, the wafer 10 includes a first substrate 102, a first device layer 103, a first interconnect structure 104, a first passivation layer 110, a first pad 112, and at least one first through-substrate via (TSV) 115.

In some embodiments, the first substrate 102 may include silicon or other semiconductor materials. Alternatively, or additionally, the first substrate 102 may include other elementary semiconductor materials such as germanium. In some embodiments, the first substrate 102 is made of a compound semiconductor such as silicon carbide, gallium arsenic, indium arsenide or indium phosphide. In some embodiments, the first substrate 102 is made of an alloy semiconductor such as silicon germanium, silicon germanium carbide, gallium arsenic phosphide, or gallium indium phosphide. In some embodiments, the first substrate 102 includes an epitaxial layer. For example, the first substrate 102 has an epitaxial layer overlying a bulk semiconductor.

Referring to FIG. 1A, the first device layer 103 is formed over the first substrate 102. The first device layer 103 includes a wide variety of integrated circuit devices (not shown) formed over the first substrate 102. In some embodiments, the integrated circuit devices may include active devices (e.g., diodes, transistors, optoelectronic devices, or like), passive devices (e.g., resistors, capacitors, inductors, or like). The first interconnect structure 104 is formed over the first device layer 103. In detail, the first interconnect structure 104 includes a first insulating material 106 and a plurality of first metal features 108. The first metal features 108 are formed in the first insulating material 106 and electrically connected with each other. A portion of the first metal features 108, such as top metal features, is exposed by the first insulating material 106. In some embodiments, the first insulating material 106 includes silicon oxide, silicon oxynitride, silicon nitride, low dielectric constant (low-k) materials or a combination thereof. In some alternative embodiments, the first insulating material 106 may be a single layer or multiple layers. In some embodiments, the first metal features 108 include plugs and metal lines. The first metal features 108 may be made of tungsten (W), copper (Cu), copper alloys, aluminum (Al), aluminum alloys, or a combination thereof.

Referring to FIG. 1A, the first TSV 115 penetrates through the first substrate 102 to be electrically connected to the first interconnect structure 104. In some embodiments, the first TSV 115 includes a conductive via and a diffusion barrier layer (not shown) surround the conductive via. The conductive via may include copper, copper alloys, aluminum, aluminum alloys, or combinations thereof. The diffusion barrier layer may include Ta, TaN, Ti, TiN, CoW or a combination thereof.

Referring to FIG. 1A, the first passivation layer 110 is formed over the first interconnect structure 104. The first passivation layer 110 covers the first insulating material 106 and a portion of the top metal features 108b. Further, the portion of the top metal features 108b is covered by the first passivation layer 110, and another portion of the top metal features 108a is exposed by the first passivation layer 110, so that the another portion of the top metal features 108a may be electrically connected with the first pad 112. In some embodiments, the first passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like.

Referring to FIG. 1A, the first pad 112 is formed over the top metal features 108b and extends to cover a portion of the first passivation layer 110. A material of the first test pad 112 is different from the material of the first metal features 108, for example. In some embodiments, the material of the first test pad 112 is softer than the material of the first metal features 108. In some embodiments, the first pad 112 includes a metal material, such as aluminum, copper, nickel, gold, silver, tungsten, or a combination thereof. The first pad 112 may be formed by depositing a metal material layer through a suitable process such as electro-chemical plating process, CVD, atomic layer deposition (ALD), PVD or the like, and then patterning the metal material layer.

Referring to FIG. 1A, a dielectric layer 114 is formed over the front side S1 of the wafer 10. That is, the dielectric layer 114 covers the first pad 112 and the first passivation layer 110. In some embodiments, the dielectric layer 114 includes silicon oxide, silicon nitride, polymer or a combination thereof. The dielectric layer 114 is formed by depositing a dielectric material through a suitable process such as spin coating, CVD or the like, and then performing a planarization process on the dielectric material. After the dielectric layer 114 is formed, a dielectric layer 116 is formed over the dielectric layer 114. In some embodiments, the dielectric layer 116 includes silicon oxide, silicon nitride, polymer or a combination thereof, and is formed by a suitable process such as spin coating, CVD or the like.

Referring to FIG. 1A, the wafer 10 and the carrier C are bonded together via the dielectric layer DI and the dielectric layer 116. That is, the dielectric layer DI and the dielectric layer 116 are bonded via a dielectric-to-dielectric bonding or a fusion bonding.

Figure 1B:
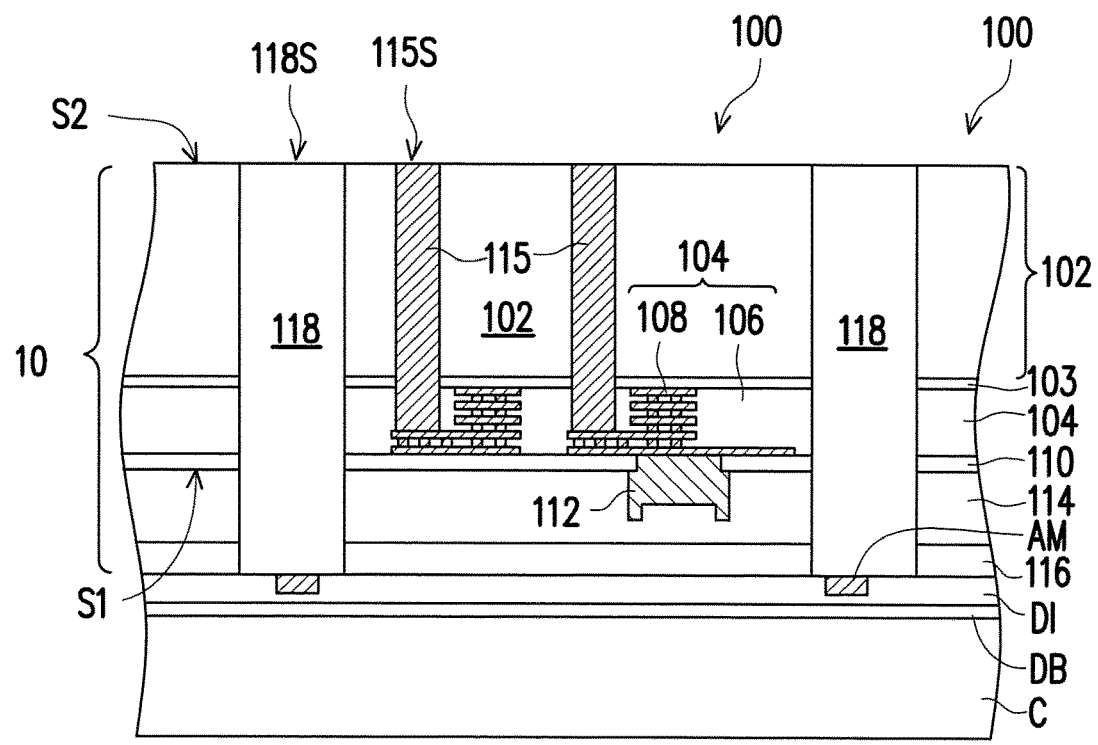

Referring to FIG. 1B, a plurality of isolation structures 118 are formed in the wafer 10 to divided the wafer 10 into a plurality of first dies 100. That is, the isolation structures 118 are disposed between the first dies 100 respectively, so that the first dies 100 are separated from each other. The first dies 100 may have the same function or different functions. In some embodiments, the first dies 100 includes an application-specific integrated circuit (ASIC) chip, an analog chip, a sensor chip, a wireless such as Bluetooth, and radio frequency chip, a voltage regulator chip or a memory chips such as dynamic random access memory (DRAM) chip or static random access memory (SRAM) chip. The isolation structures 118 are formed as following steps, for example. A plurality of openings (not shown) are formed to penetrate through the first substrate 102, the first device layer 103, the first interconnect structure 104, the first passivation layer 110, and the dielectric layers 114 and 116, so that a surface of the alignment marks AM are exposed by the openings. An isolation material is filled in the openings to form the isolation structures 118. In some embodiments, one of the isolation structures 118 is aligned with one of the alignment marks AM. In some embodiments, the isolation material includes silicon oxide, silicon nitride, silicon oxynitride, or a combination thereof, and is formed by CVD. In some alternative embodiments, one of the isolation structures 118 includes a gap fill dielectric pillar and a liner layer encapsulating the gap fill dielectric pillar (not shown). The number of the first dies 100 and the isolation structures 118 is not limited in this disclosure.

Referring to FIG. 1B, after the isolation structures 118 are formed, a thinning process is performed on the back side S2 of the wafer 10 to expose the first TSV 115. In some embodiments, the thinning process includes a chemical mechanical polishing (CMP) process, an etching back process, or a combination thereof. In the case, the back side S2 of the wafer 10, the top surfaces 118S of the isolation structures 118, and the top surface 115S of the first TSV 115 are coplanar after the thinning process. Herein, since the wafer 10 is divided into the first dies 100, the front side S1 and the back side S2 of the wafer 10 may be referred as the front side S1 and the back side S2 of the first die 100 or the first substrate 102.

Figure 1C:
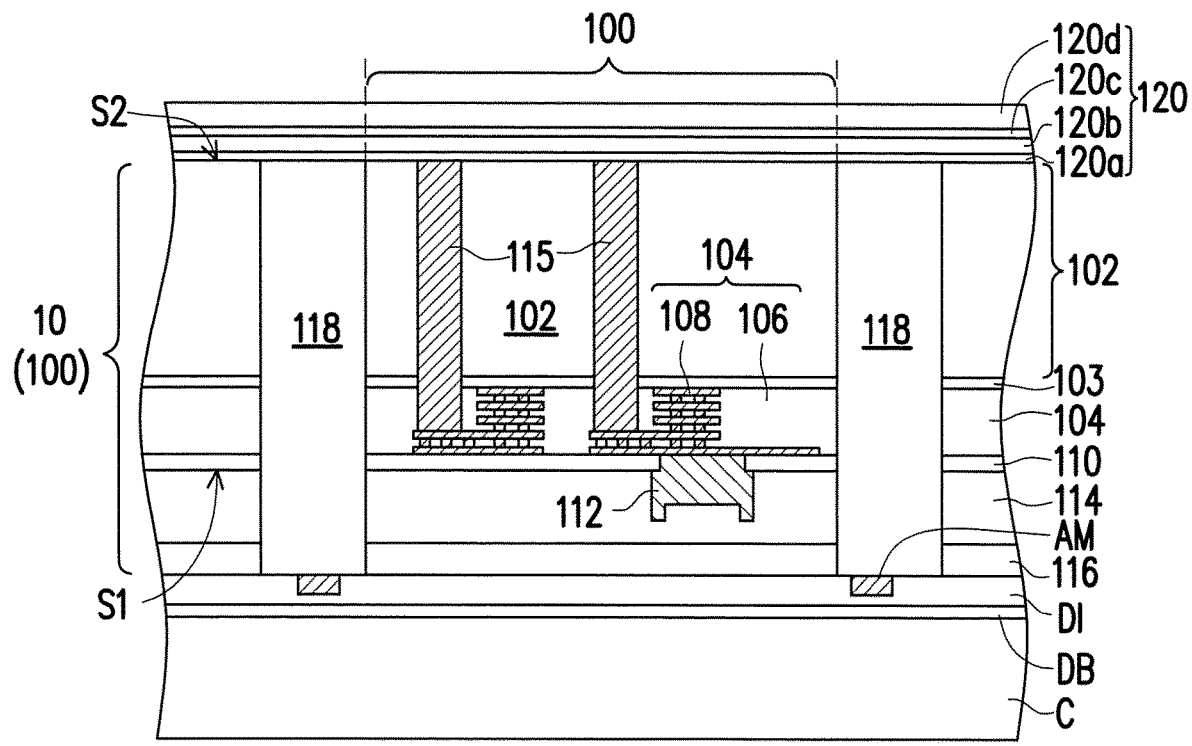

Referring to FIG. 1C, after the thinning process is performed, a first bonding dielectric layer 120 is formed over the back side S2 of the first die 100. The first bonding dielectric layer 120 covers the back side S2 of the first die 100, the first TSV 115, and the isolation structures 118. In some embodiments, the first bonding dielectric layer 120 includes bonding dielectric materials 120a, 120b, 120c, and 120d stacked in order. In some embodiments, the bonding dielectric materials 120a, 120b, 120c, and 120d may include silicon oxide, silicon nitride, polymer or a combination thereof, and are formed by depositing a dielectric material through a suitable process such as spin coating, CVD or the like, and then performing a planarization process on the dielectric material. In some embodiments, the function and material of the bonding dielectric materials 120a, 120b, 120c, and 120d may be the same or different from each other. For example, the dielectric materials 120a and 120c may be silicon nitride and used for etching stop layers, while the dielectric materials 120b and 120d may be silicon oxide and used for bonding.

Figure 1D:
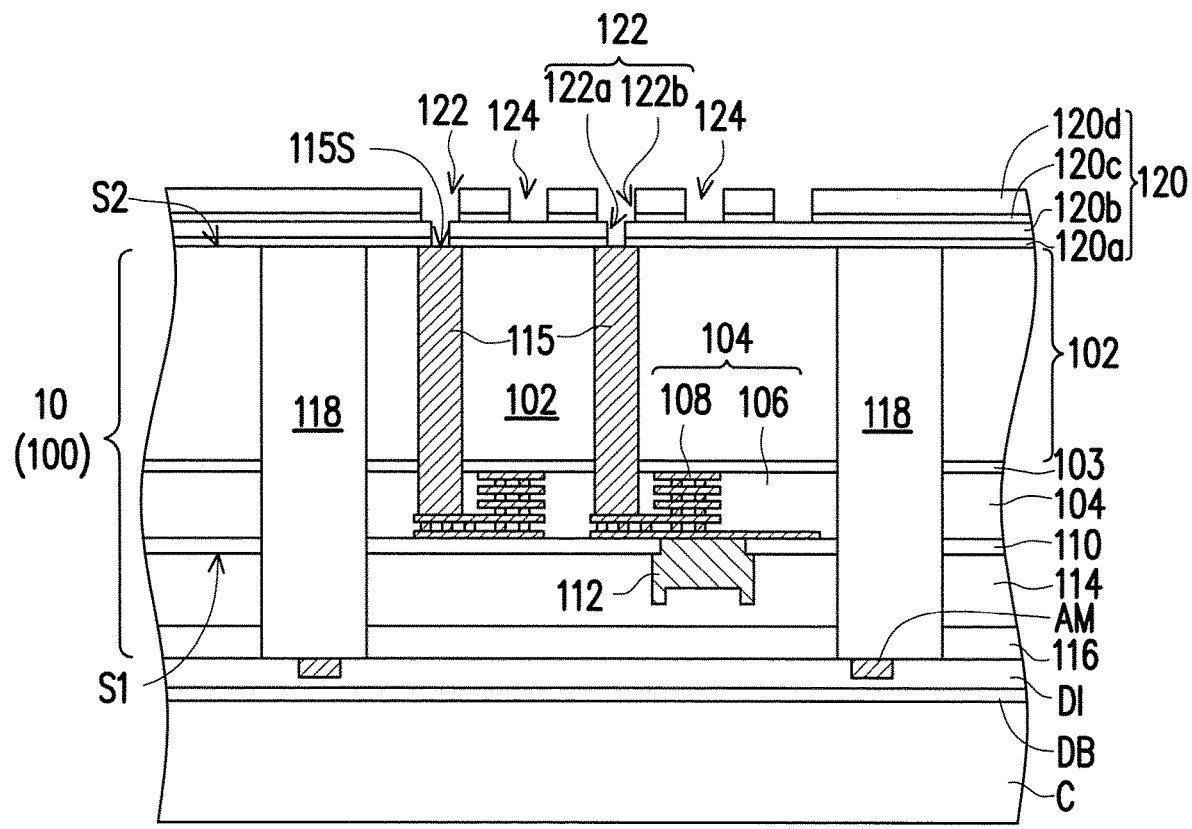

Referring to FIGS. 1C and 1D, a plurality of openings 122 and 124 are formed in the first bonding dielectric layer 120. In some embodiments, the opening 122 corresponds to the first TSV 115 and exposes the top surface 115S of the first TSV 115. The opening 122 may be, but not limited, a dual damascene opening. That is, the opening 122 includes a narrower via hole 122a and a wider trench 122b over the narrower via hole 122a. In some embodiments, the via hole 122a is formed as following steps (referred as the trench first process). The dielectric material 120d is patterned by lithography and etching processes to form trenches 122b therein. The trenches 122b are corresponding to the first TSV 115. During the etching process, the dielectric material 120c serves as an etching stop layer, and thus the dielectric material 120c is exposed by the trenches 122b. In some alternative embodiments, the dielectric material 120c may be etched to expose the dielectric material 120b (as shown in FIG. 1D). Next, the dielectric material 120b are patterned by lithography and etching process to form via holes 122a therein. During the etching process, the dielectric material 120a serves as an etching stop layer. Thereafter, the dielectric material 120a exposed by the via holes 122a is removed by an etching process, so that the via holes 122a expose the top surface 115S of the first TSV 115.

In some embodiments, the bottom width (or area) of the narrower via hole 122a is less than the width (or area) of the top surface 115S of the first TSV 115. In some alternative embodiments, the bottom width (or area) of the narrower via hole 122a is equal to the width (or area) of the top surface 115S of the first TSV 115. On the other hand, the opening 124 may be, but not limited, a single damascene opening. In some embodiments, the opening 124 may be referred as a trench 124 formed by patterning the dielectric material 120d with the dielectric material 120c serves as an etching stop layer. In some embodiments, the opening 124 may stop at and exposes the dielectric material 120c. In some other embodiments, the opening 124 exposes the top surface of the dielectric material 120b.

Figure 1E:
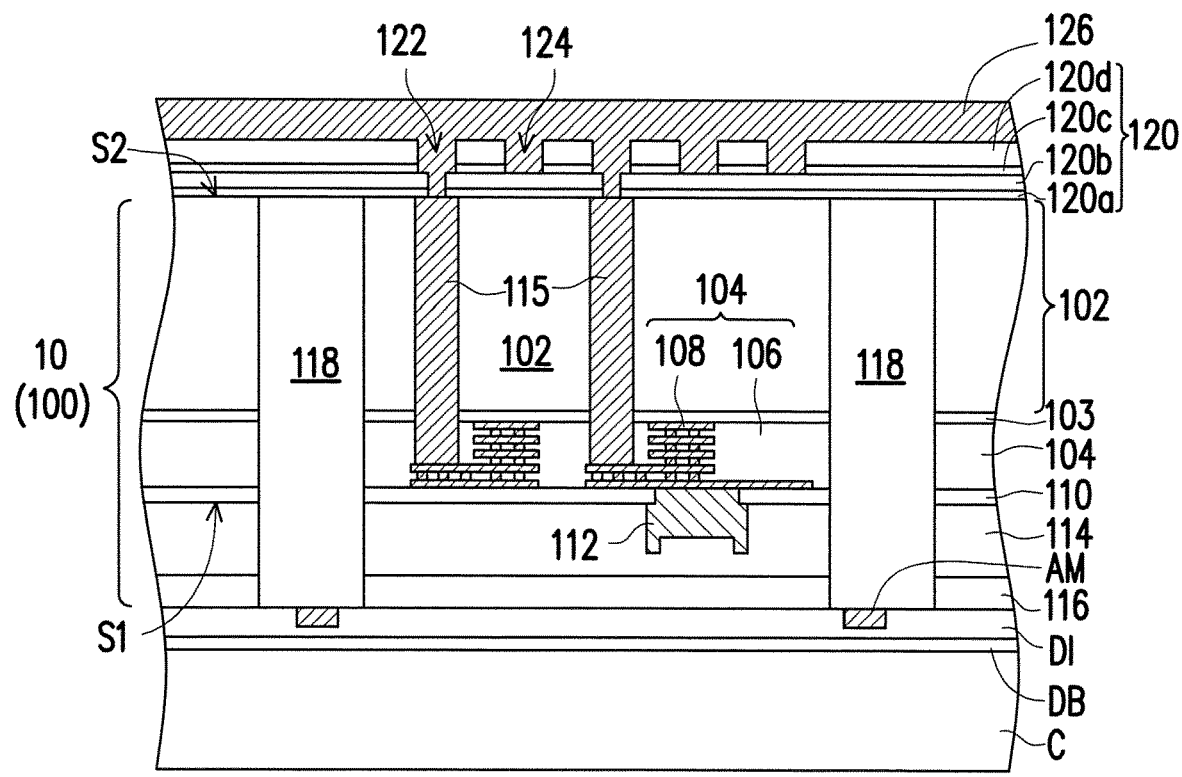

Referring to FIG. 1E, a metal material 126 is formed over the first bonding dielectric layer 120 and filled in the openings 122 and 124. In some embodiments, the metal material 126 may be aluminum, copper, nickel, gold, silver, tungsten, or a combination thereof and formed by electrochemical plating process, CVD, PVD or the like.

Figure 1F:
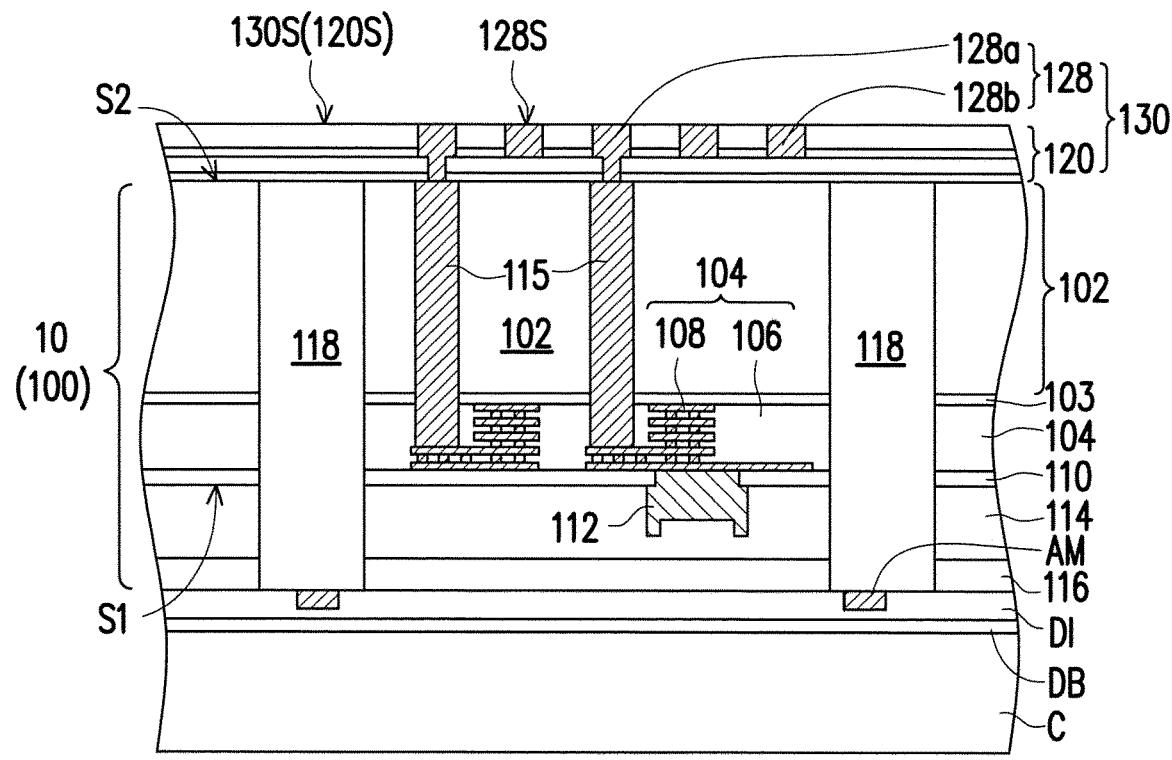

Referring to FIGS. 1E and 1F, a planarization process is performed to remove a portion of the metal material 126, so that the top surface 120S of the first bonding dielectric layer 120 is exposed. In some embodiments, the planarization process includes a CMP process, an etching back process, or a combination thereof. In the case, as shown in FIG. 1F, a first bonding structure 130 is formed over the back side S2 of the first die 100 or the first substrate 102 after the planarization process. In detail, the first bonding structure 130 may include the first bonding dielectric layer 120 and a first bonding metal layer 128 formed or embedded in the first bonding dielectric layer 120. The first bonding metal layer 128 may include a first bonding metal material 128a formed from the metal material 126 filled in the opening 122 and a first bonding metal material 128b formed from the metal material 126 filled in the opening 124. In some embodiments, the first bonding metal material 128a may be a dual damascene structure and connected with the first TSV 115. In some embodiments, as shown in FIG. 1F, a bottom area of the first bonding metal material 128a is less than the top area of the first TSV 115 connected with the first bonding metal material 128a. The first bonding metal material 128b may be a single damascene structure and formed over the bonding dielectric material 120b. In other words, the first bonding metal material 128a may include a bump via and a bump metal line over the bump via, and the first bonding metal material 128b may include a bump metal line.

It should be noted that the top surface 120S of the first bonding dielectric layer 120 and the top surface 128S of the first bonding metal layer 128 are coplanar after the planarization process. In some embodiments, a bondable topography variation (BTV) of a top surface 130S of the first bonding structure 130 may be less than 1 μm per 1 mm range to ease to directly bond to other dies or chips. Here, the bondable topography variation (BTV) is referred as a height difference between a highest point and a lowest point of the top surface 130S of the first bonding structure 130. In some alternative embodiments, a bondable topography slope (BTS) of a top surface 130S of the first bonding structure 130 may be less than 0.001. Here, the bondable topography slope (BTS) is referred as a ratio of the vertical variation to the horizontal variation between the highest point and the lowest point, of the top surface 130S of the first bonding structure 130.

Figure 1G:
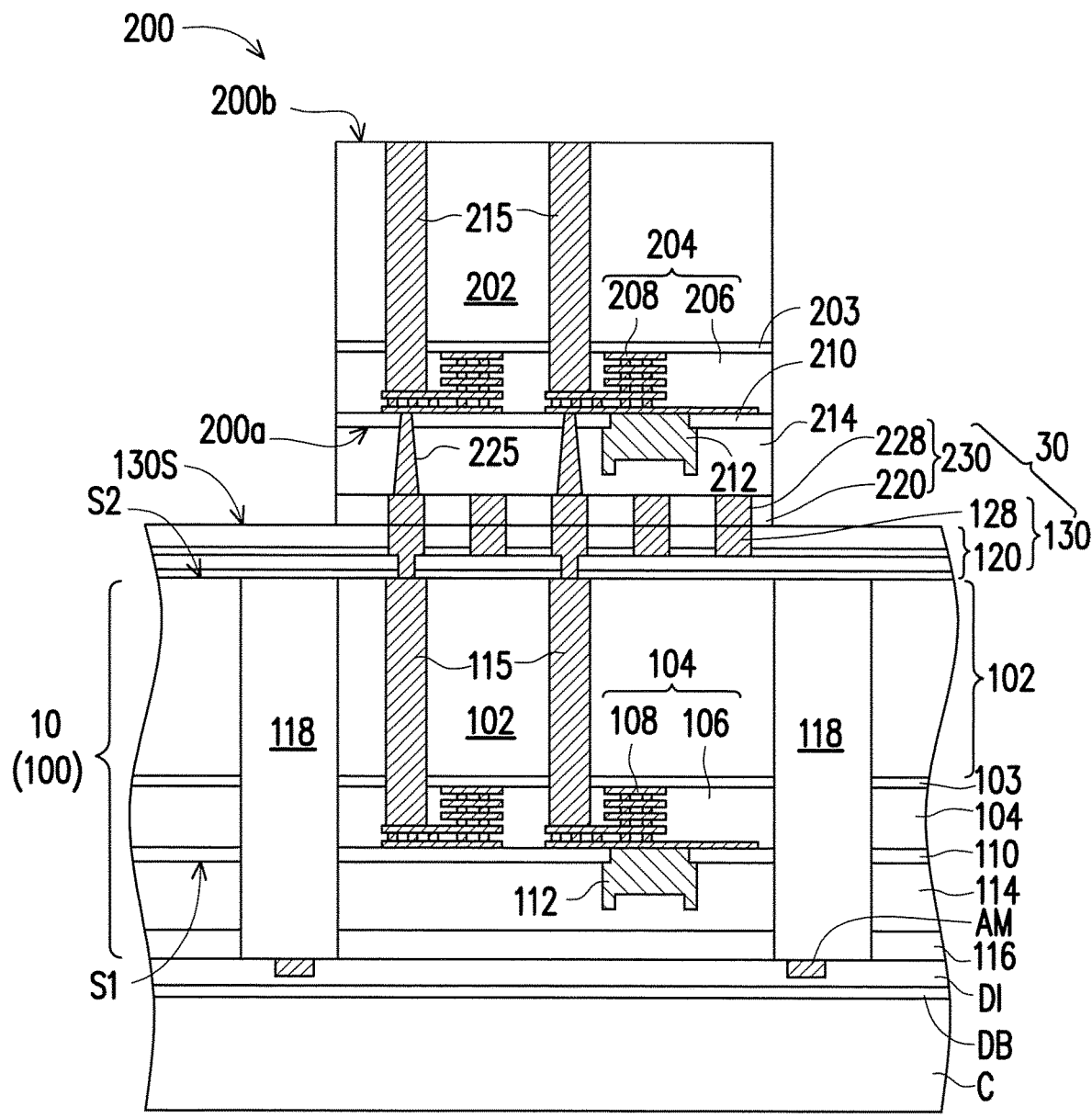

Referring to FIGS. 1F and 1G, a second die 200 having a front side 200a and a back side 200b opposite to each other is provided. In some embodiments, the second die 200 includes a second substrate 202, a second device layer 203, a second interconnect structure 204 including a second insulating material 206 and a plurality of second metal features 208, a second passivation layer 210, a second pad 212, and at least one second through-substrate via (TSV) 215. The arrangement, material and forming method of the second die 200 are similar to the arrangement, material and forming method of the first die 100. Thus, details thereof are omitted here. In some embodiments, the second die 200 and the first dies 100 may have the same function or different functions. In some embodiments, the second die 200 includes an application-specific integrated circuit (ASIC) chip, an analog chip, a sensor chip, a wireless such as Bluetooth, and radio frequency chip, a voltage regulator chip or a memory chips such as dynamic random access memory (DRAM) chip or static random access memory (SRAM) chip.

Referring to FIG. 1G, a second bonding structure 230 is formed over the front side 200a of the second die 200. In some embodiments, the second bonding structure 230 has a second bonding dielectric layer 220 and a second bonding metal layer 228 formed or embedded in the second bonding dielectric layer 220. The second bonding metal layer 228 are electrically connected with the second interconnect structure 204 via a bump via 225 formed in the dielectric layer 214 over the second passivation layer 210. The second die 200 is flipped, so that the front side 200a of the second die 200 faces toward the back side S2 of the first die 100. The first die 100 and the second die 200 are bonded together via the first bonding structure 130 and the second bonding structure 230. That is, the first bonding structure 130 and the second bonding structure 230 are bonded together by a hybrid bonding to form a hybrid bonding structure 30. The first bonding structure 130 and the second bonding structure 230 are hybrid bonded together by the application of pressure and heat.

It is noted that the hybrid bonding involves at least two types of bonding, including metal-to-metal bonding and non-metal-to-non-metal bonding such as dielectric-to-dielectric bonding or fusion bonding. As shown in FIG. 1G, the hybrid bonding structure 30 includes the first bonding metal layer 128 and the second bonding metal layer 228 bonded by metal-to-metal bonding and the first bonding dielectric layer 120 and the second bonding dielectric layer 220 bonded by non-metal-to-non-metal bonding.

As shown in FIG. 1G, a die stack structure 1 is accomplished after the first die 100 and the second die 200 are bonded together. In some embodiments, compared with the conventional chip-on-wafer (CoW) structure, the die stack structure 1 of some embodiments has less bondable topography variation of the top surface 130S of the first bonding structure 130. Therefore, the die stack structure 1 is able to stack more dies or chips over the wafer 10, so as to increase the usage area of the die stack structure 1.

FIG. 2A to FIG. 2I are cross-sectional views of a method of forming a die stack structure in accordance with a second embodiment.

Figure 2A:
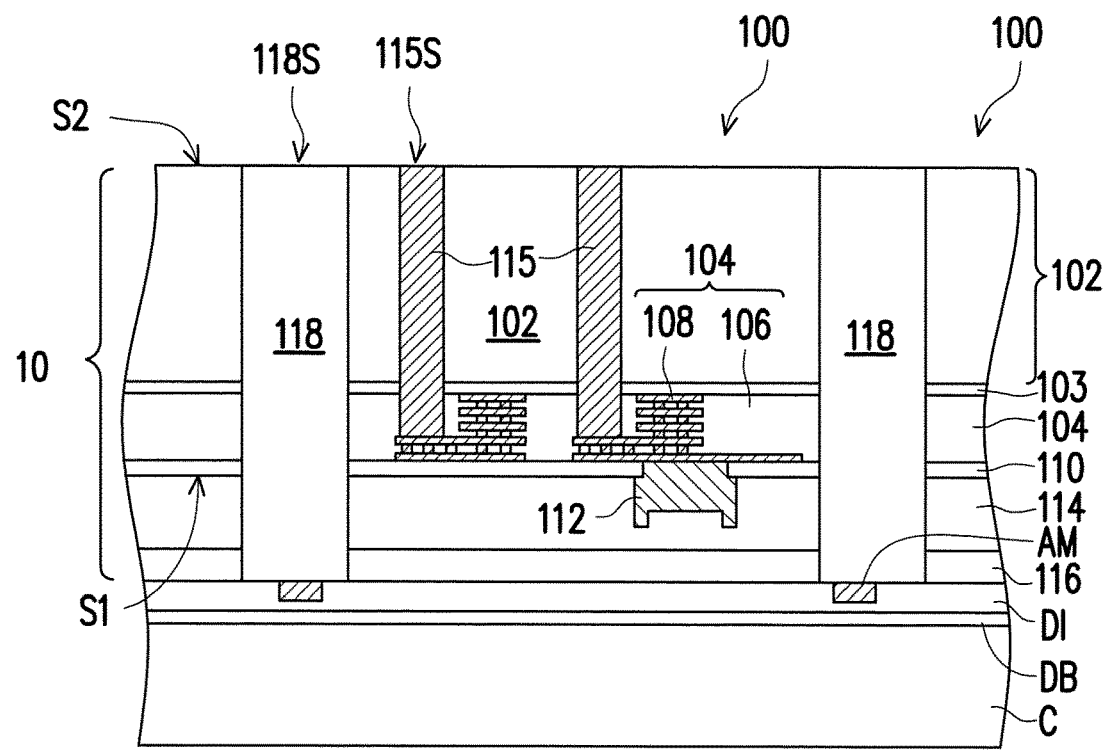
FIG. 2A to FIG. 2I are cross-sectional views of a method of forming a die stack structure in accordance with a second embodiment.

Referring to FIG. 2A, the structure of FIG. 2A is similar to the structure of FIG. 1B. The material and the forming method of the elements shown in FIG. 2A are discussed in the foregoing. Thus, details thereof are omitted here.

Figure 2B:
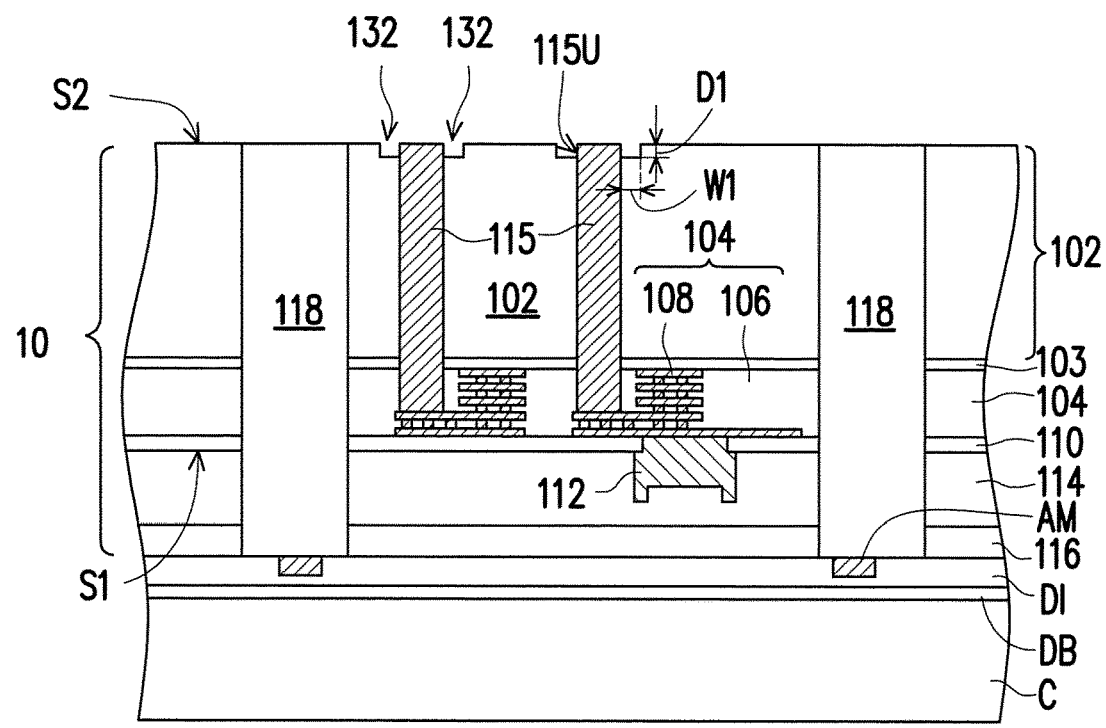

Referring to FIG. 2B, after the thinning process is performed, a portion of the first substrate 102 is removed or recessed to form a recess 132 aside the first TSV 115. The recess 132 is formed by depositing a mask pattern (not shown) over the back side S2 of the first substrate 102 to expose the surface of the first substrate 102 to-be-formed recess 132, and then performing an etching process on the back side S2 of the first substrate 102. In some embodiments, the recess 132 surrounds the first TSV 115 and exposes an upper sidewall 115U of the first TSV 115. In some embodiments, the depth D1 of the recess 132 may be 500 Å to 1000 Å, and the width W1 of the recess 132 may be 0.8 μm to 100 μm. In some alternative embodiments, the recess 132 may be a ring opening surrounding the upper portion of the first TSV 115.

Figure 2C:
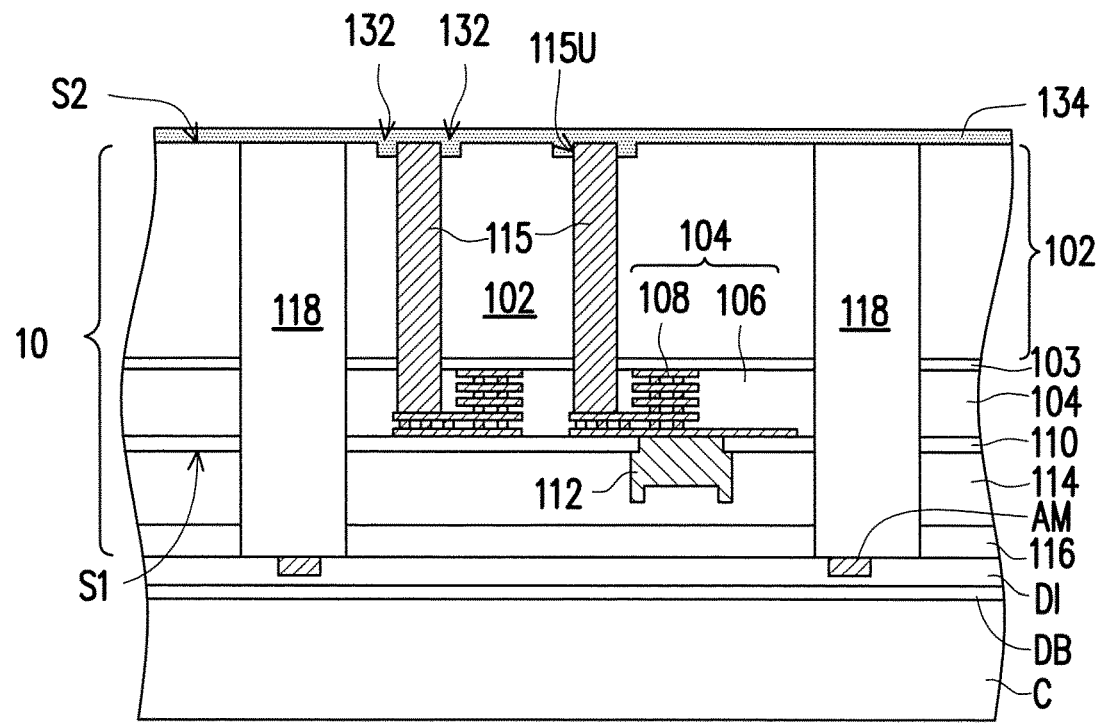

Referring to FIG. 2C, an isolation material 134 is blankly formed over the back side S2 of the first substrate 102. The isolation material 134 is filled in the recess 132 and extends to cover the back side S2 of the first substrate 102, the first TSV 115, and the isolation structures 118. In some embodiments, the isolation material 134 includes a dielectric material, such as silicon oxide, silicon nitride, silicon oxynitride, or a combination thereof, and is formed by a suitable process such as CVD, ALD, or the like. In some embodiments, a thickness of the isolation material 134 is larger than 4000 Å.

Figure 2D:
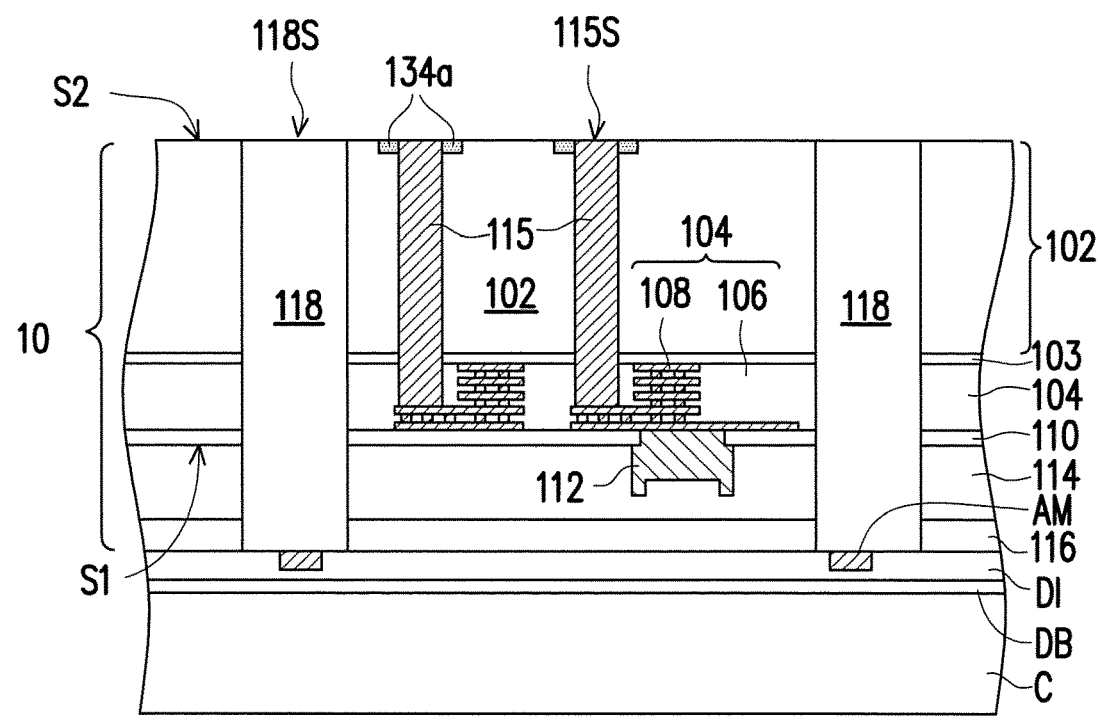
Figure 2E:
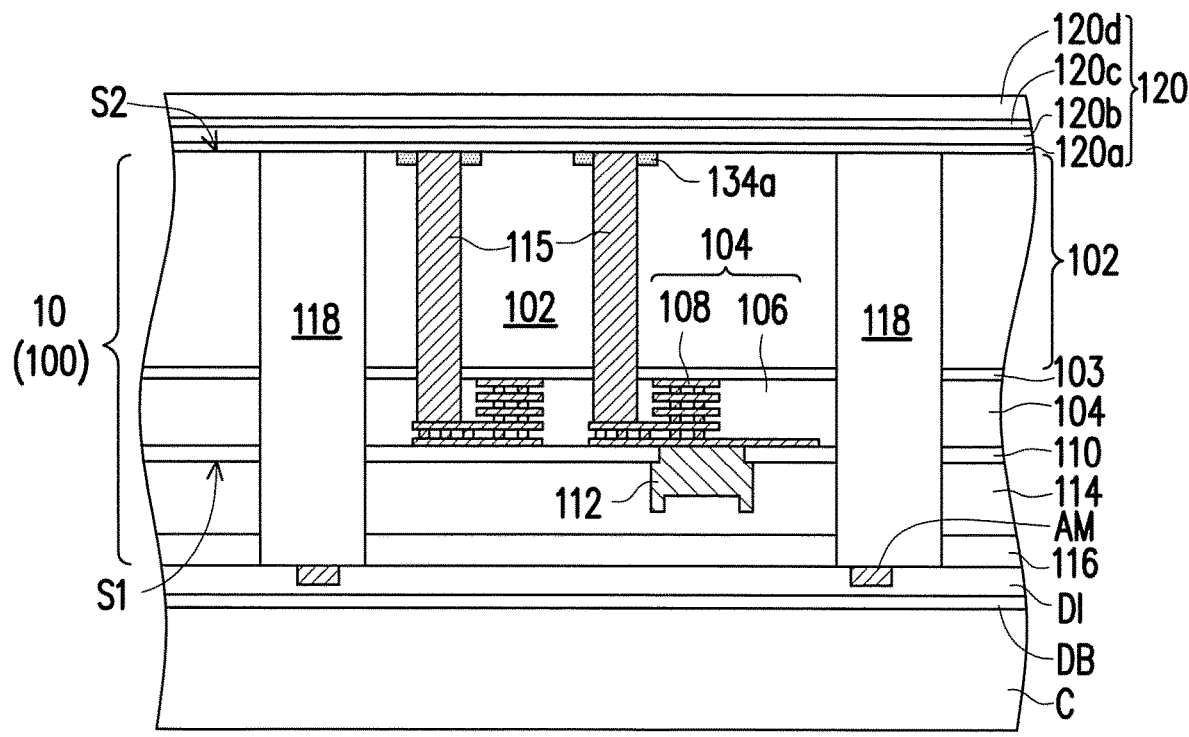

Referring to FIGS. 2C and 2D, a planarization process is performed on the isolation material 134 to expose the back side S2 of the first substrate 102, so that an isolation structure 134a surrounding the upper portion of the first TSV 115 is formed. In some embodiment, the isolation structure 134a surrounding the upper portion of the first TSV 115 is able to avoid the metal (e.g., Cu) of the first TSV 115 or to-be-formed first bonding metal layer 128 (as shown in FIG. 2H) from diffusing into the first substrate 102. In other words, the first TSV 115 or to-be-formed first bonding metal layer 128 and the first substrate 102 are electrically isolated from each other by the isolation structure 134a surrounding the upper portion of the first TSV 115. Therefore, the leakage issue is able to be prevented. In some embodiments, the back side S2 of the first substrate 102, the top surfaces 118S of the isolation structures 118, and the top surface 115S of the first TSV 115 are coplanar after the planarization process. In some embodiments, the planarization process includes a chemical mechanical polishing (CMP) process, an etching back process, or a combination thereof.

Referring to FIGS. 2E to 2H, a first bonding structure 130 is formed over the back side S2 of the first substrate 102, the isolation structure 134a, and the first TSV 115. The forming method of the first bonding structure 130 are similar to the forming method of FIGS. 1C to 1F. The material and the forming method of the above elements are discussed in the foregoing. Thus, details thereof are omitted here.

Figure 2F:
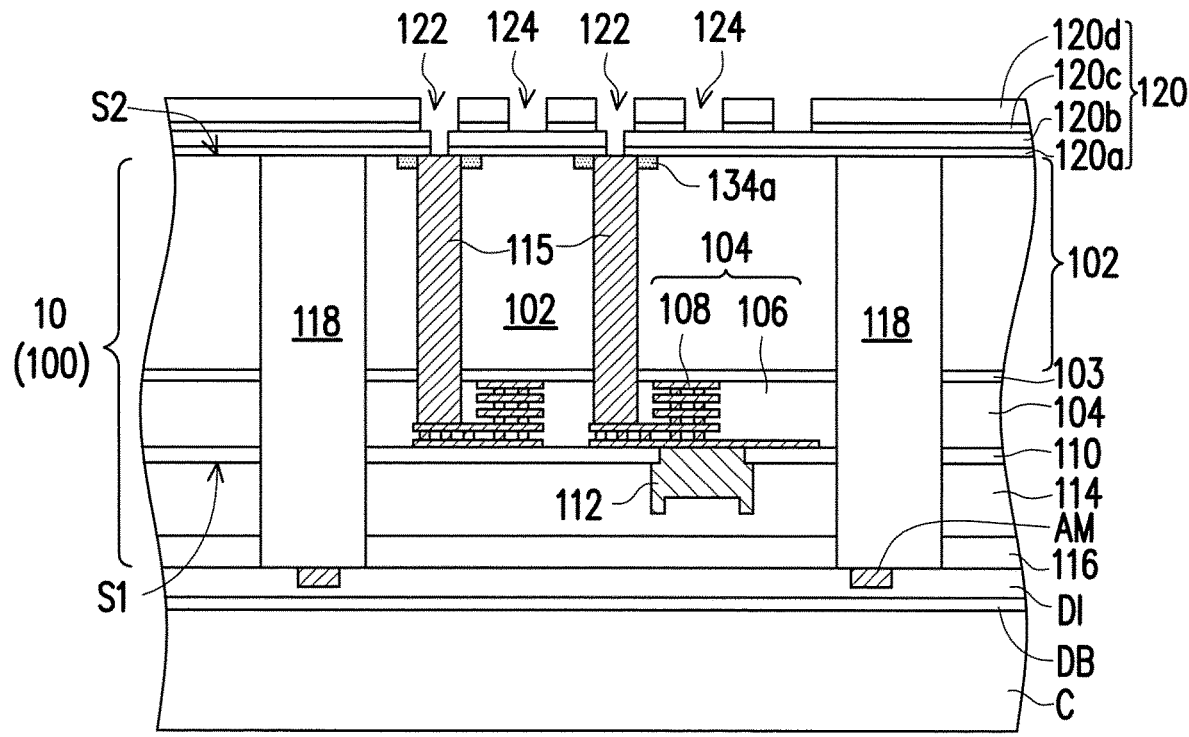
Figure 2G:
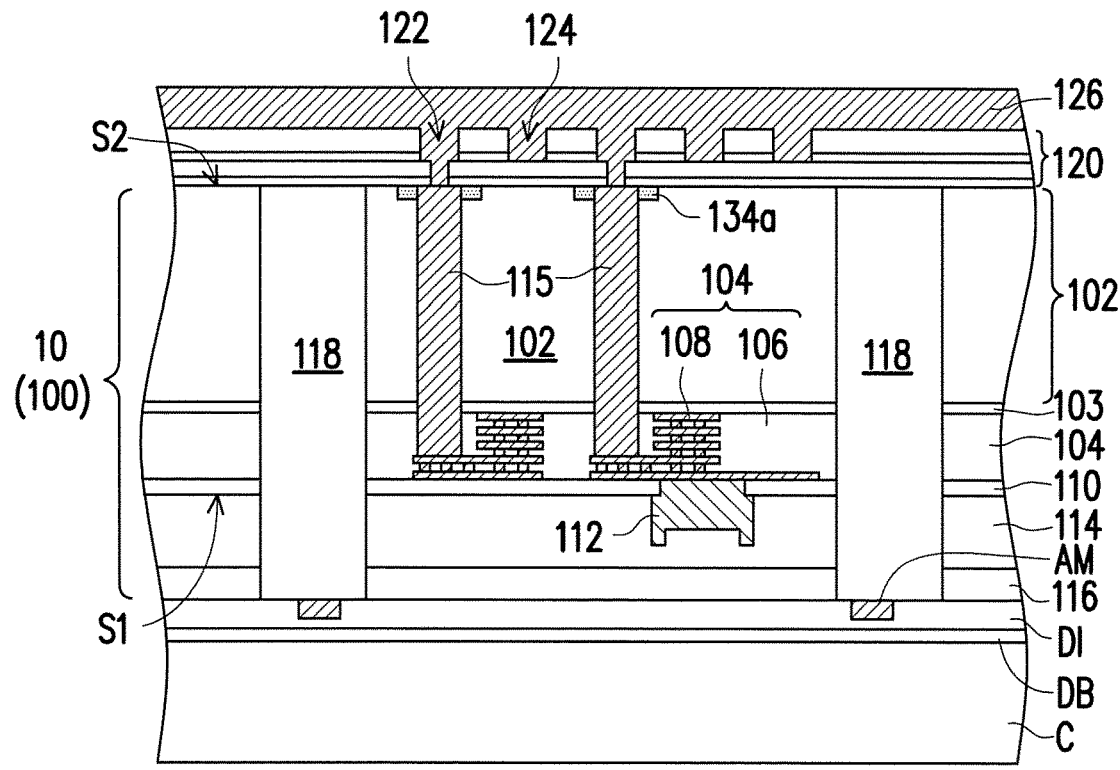
Figure 2H:
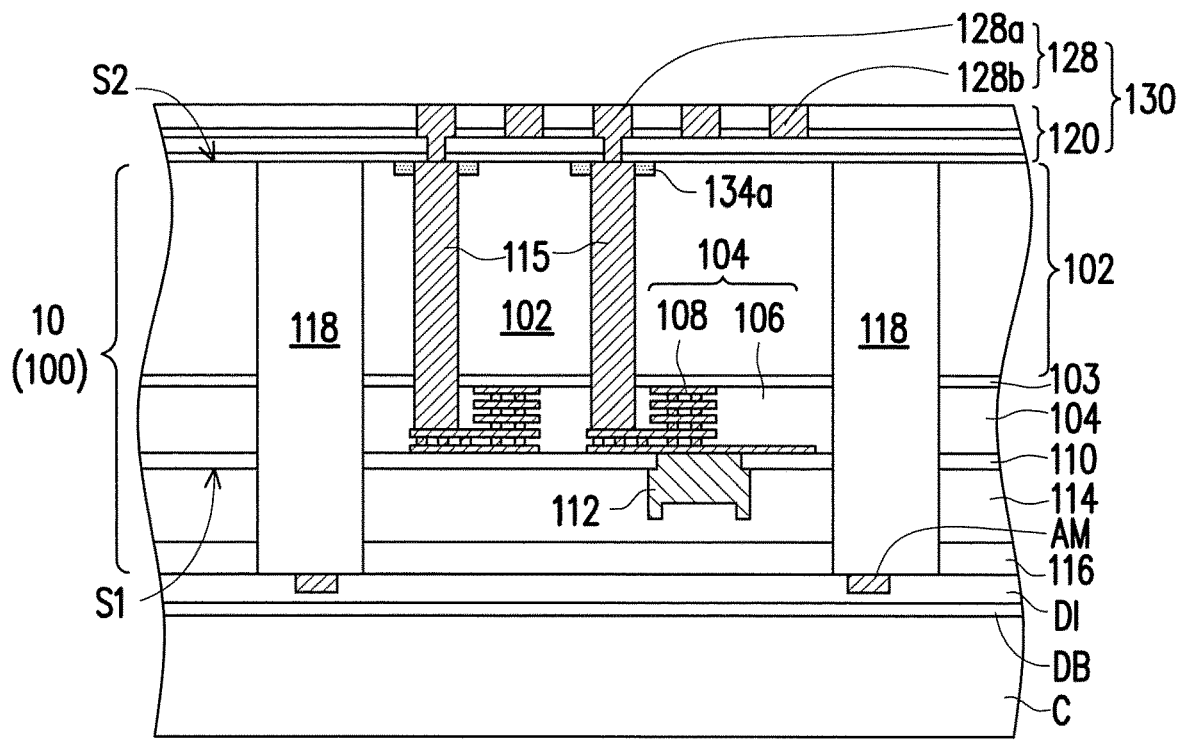

It should be noted that, in some embodiments, the isolation structure 134a surrounding the upper portion of the first TSV 115 may avoid the metal (e.g., Cu) of the first TSV 115 from diffusing into the first substrate 102, and may increase the process window of forming the openings 122 (shown in FIG. 2F). That is, even if the openings 122 are misaligned, a portion of the first substrate 102 still not be damaged or removed, so that the leakage current is accordingly decreased. In other words, the isolation structure 134a is able to decrease or avoid the possibility of the first bonding metal materials 128a in direct contact with the first substrate 102.

Figure 2I:
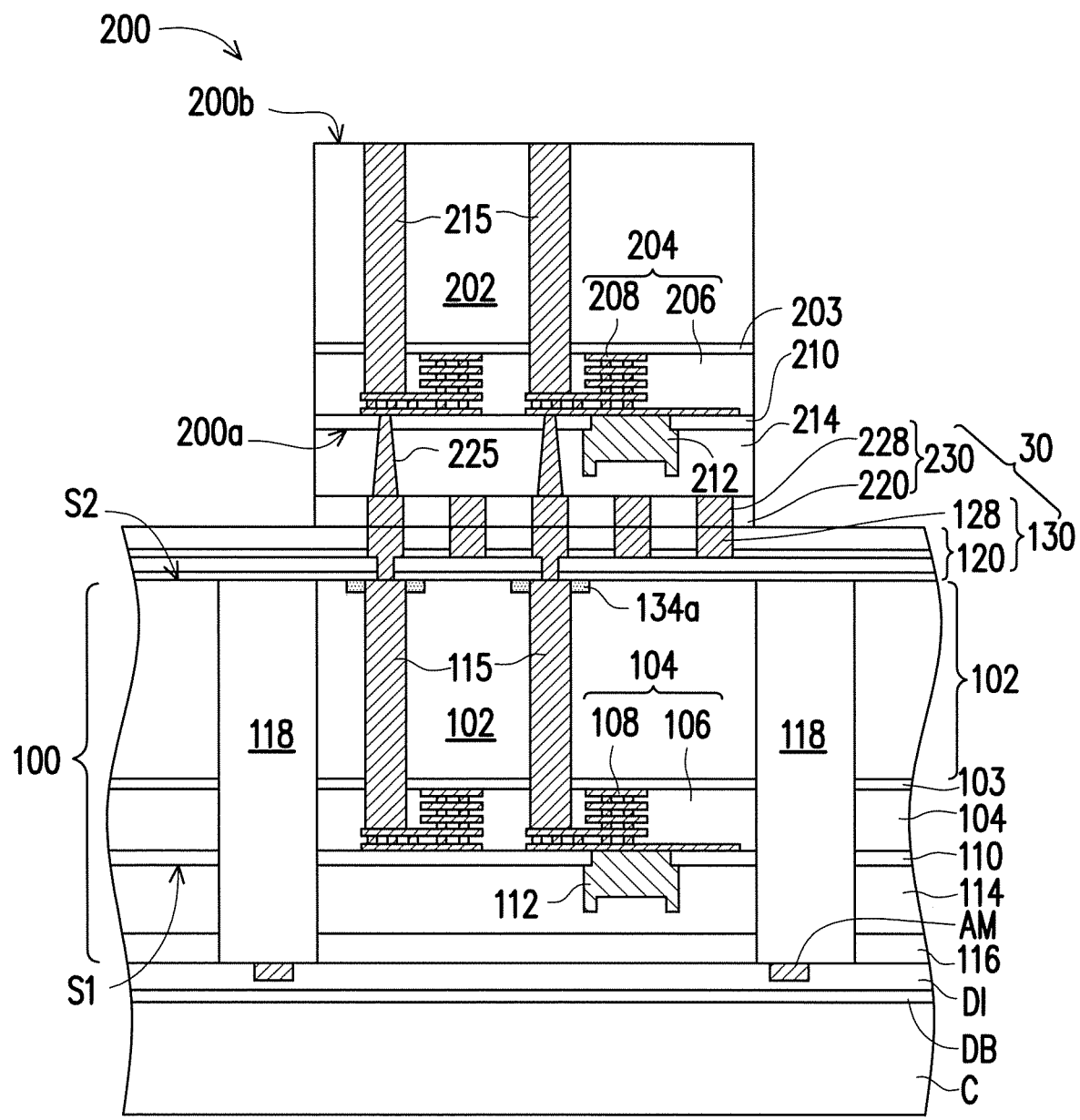

Referring to FIG. 2I, the second die 200 having the second bonding structure 230 formed over the front side 200a thereof is provided. The forming method of the second die 200 are similar to the forming method of FIG. 1G. The material and the forming method of the above elements are discussed in the foregoing. Thus, details thereof are omitted here. In some embodiments, the second die 200 is flipped, so that the front side 200a of the second die 200 faces toward the back side S2 of the first die 100. The first die 100 and the second die 200 are bonded together via the first bonding structure 130 and the second bonding structure 230. As shown in FIG. 1G, a die stack structure 2 having the isolation structure 134a surrounding the upper portion of the first TSV 115 is accordingly accomplished after the first die 100 and the second die 200 are bonded together.

FIG. 3A to FIG. 3H are cross-sectional views of a method of forming a die stack structure in accordance with a third embodiment.

Figure 3A:
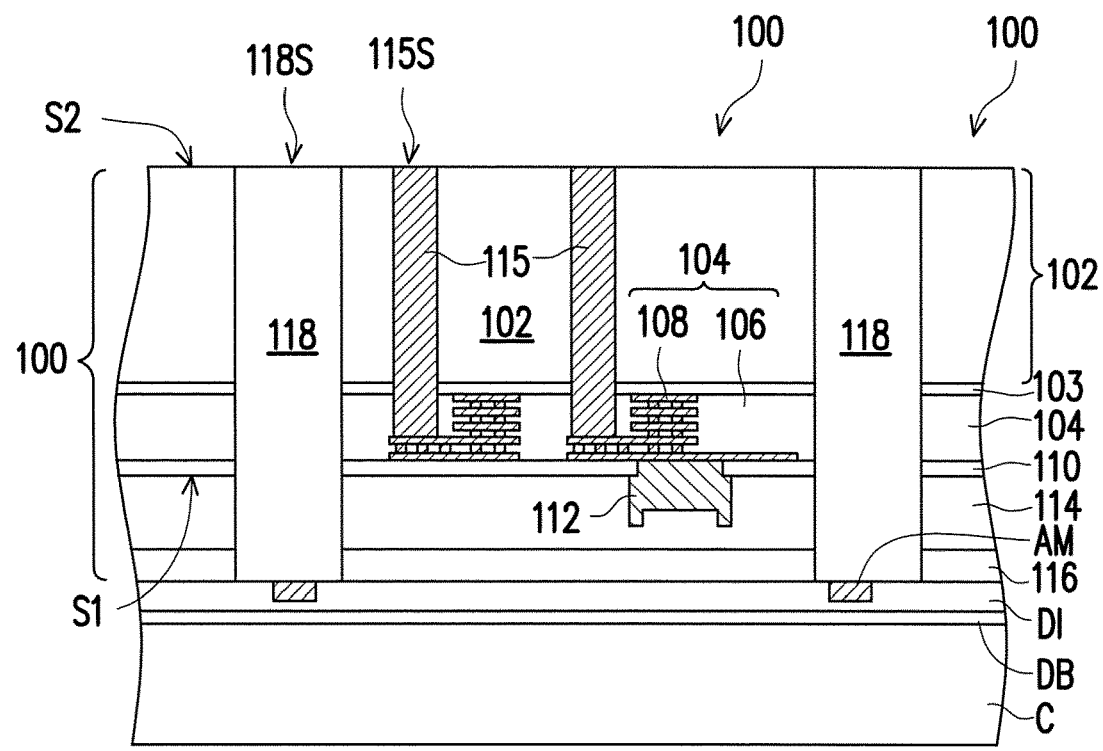
FIG. 3A to FIG. 3H are cross-sectional views of a method of forming a die stack structure in accordance with a third embodiment.

Referring to FIG. 3A, the structure of FIG. 3A is similar to the structure of FIG. 1B. The material and the forming method of the elements shown in FIG. 3A are discussed in the foregoing. Thus, details thereof are omitted here.

Figure 3B:
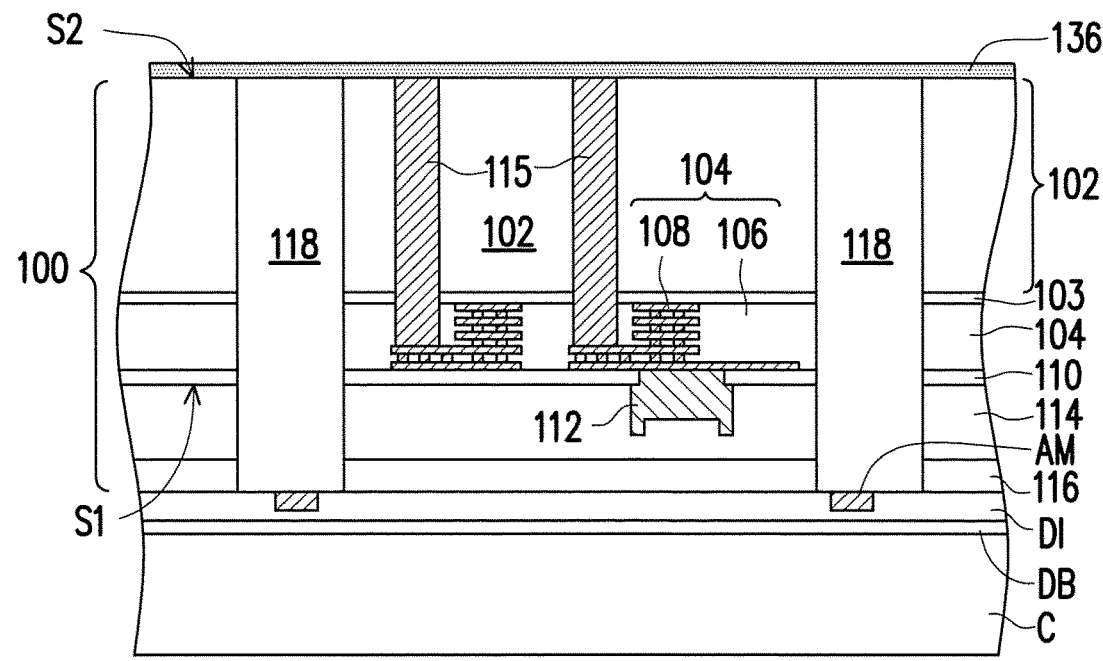

Referring to FIG. 3B, after the thinning process is performed, an etching stop layer 136 is blankly formed over the back side S2 of the first substrate 102. The etching stop layer 136 covers the back side S2 of the first substrate 102, the first TSV 115, and the isolation structures 118. In some embodiments, the etching stop layer 136 includes a dielectric material, such as silicon oxide, silicon nitride, silicon oxynitride, or a combination thereof, and is formed by a suitable process such as CVD, ALD, or the like. In some embodiments, a thickness of the etching stop layer 136 is 500 Å to 4000 Å.

Figure 3C:
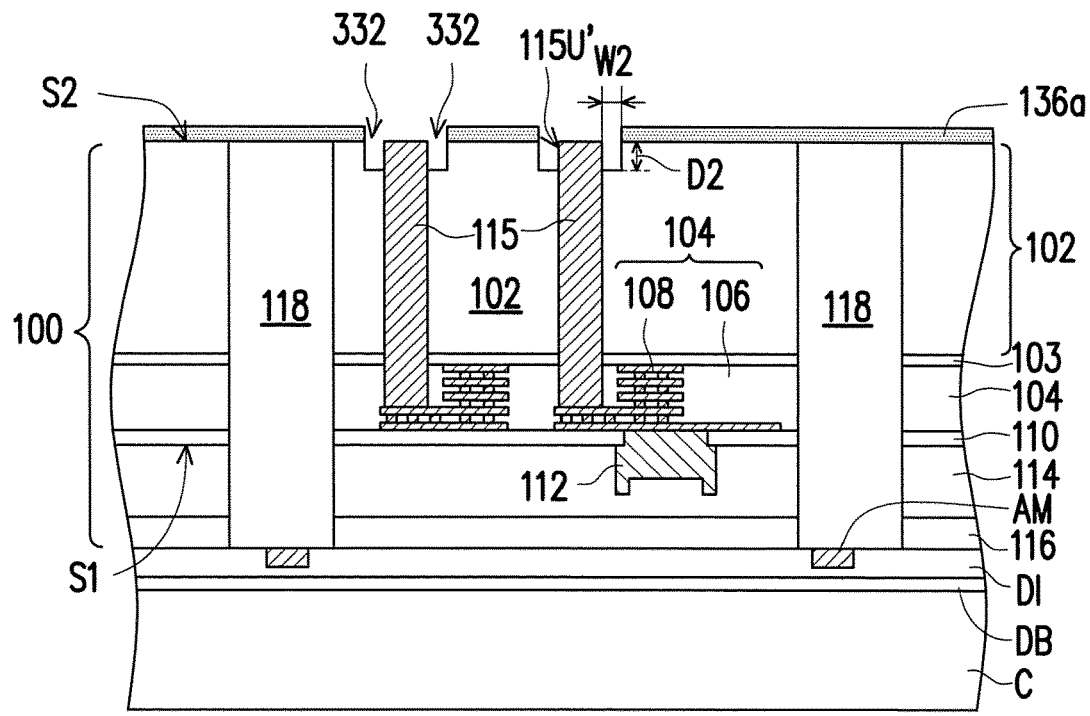

Referring to FIGS. 3B and 3C, after the etching stop layer 136 is formed, a patterning process is performed to remove a portion of the etching stop layer 136. Thereafter, a portion of the first substrate 102 is removed or recessed to form a recess 332 aside the first TSV 115. The recess 332 is formed by performing an etching process on the back side S2 of the first substrate 102 by using the etching stop layer 136a as an etching mask. In some embodiments, the recess 332 surrounds the first TSV 115 and exposes an upper sidewall 115U' of the first TSV 115. In some embodiments, the depth D2 of the recess 332 may be large than 4000 Å, and the width W2 of the recess 332 may be 0.8 μm to 100 μm. In some alternative embodiments, the recess 332 may be a ring opening surrounding the upper portion of the first TSV 115.

Figure 3D:
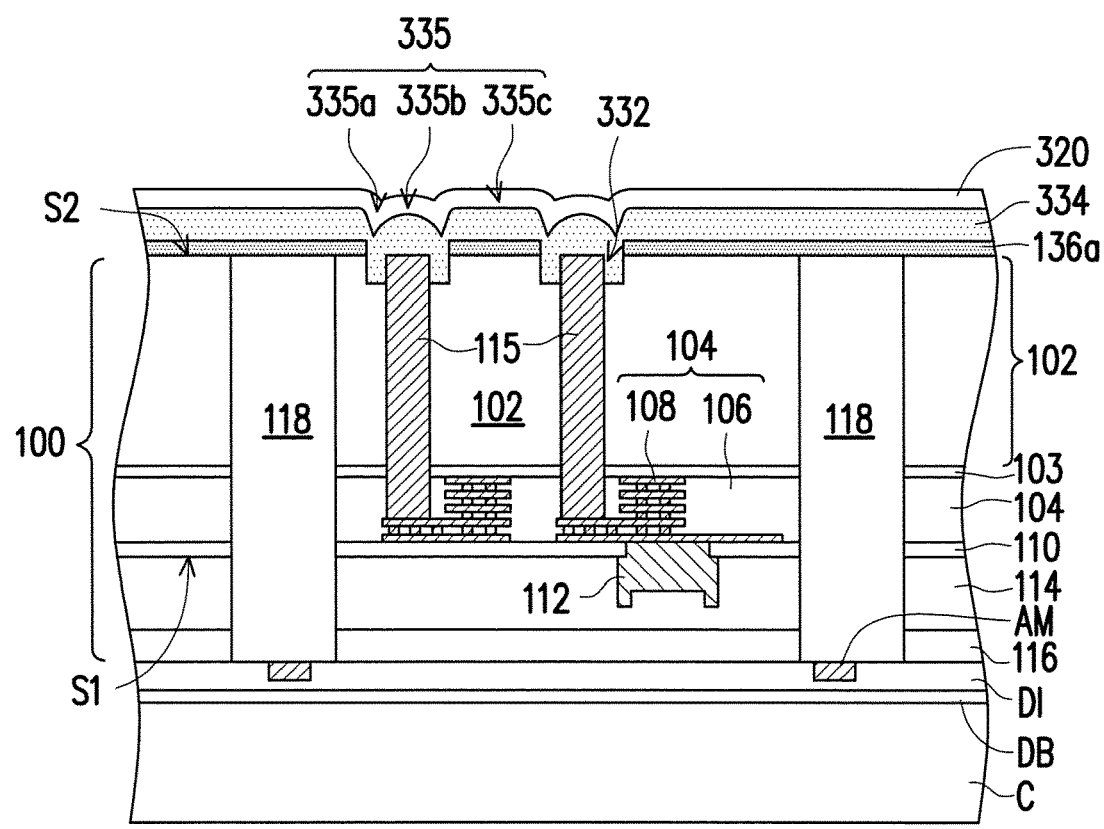

Referring to FIG. 3D, an isolation material 334 is blankly formed over the back side S2 of the first substrate 102. The isolation material 334 is filled in the recess 332 and extends to cover the back side S2 of the first substrate 102, the first TSV 115, and the isolation structures 118. In some embodiments, the isolation material 334 includes a dielectric material, such as silicon oxide, silicon nitride, silicon oxynitride, or a combination thereof, and is formed by a suitable process such as CVD, ALD, or the like. In some embodiments, a thickness of the isolation material 334 is large than 400 nm.

In some embodiment, the depth D2 of the recess 332 is deeper than the depth D1 of the recess 132 (shown in FIG. 2B), thus the top surface of the isolation material 334 is uneven. That is, the isolation material 334 may include an uneven structure 335 corresponding to the first TSV 115. The uneven structure 335 may include a concave portion 335a, a swell portion 335b, and a flat portion 335c. In detail, the concave portion 335a corresponds to the recess 332, the swell portion 335b corresponds to the first TSV 115, and the flat portion 335c corresponds to the etching stop layer 136a. The swell portion 335b is within the concave portion 335a. In some embodiment, the swell portion 335b may be, but not limited, hill-like contour. The concave portion 335a may be, but not limited, a ring structure surrounding the swell portion 335b. In detail, as shown in FIG. 3D, the top surface of the swell portion 335b may be arc profile that the middle is higher than the periphery. The flat portion 335c surrounds the swell portion 335b. In some embodiments, the top surface of the concave portion 335a is lower than the top surfaces of the swell portion 335b, and the flat portion 335c. The top surface of the swell portion 335b may be equal to or lower than the top surface of the flat portion 335c.

Referring to FIG. 3D, a first bonding dielectric layer 320 is then formed over the isolation material 334. The material of the first bonding dielectric layer 320 is differ from a material of the isolation material 334. In some embodiments, the first bonding dielectric layer 320 may include silicon oxide, silicon nitride, polymer or a combination thereof, and are formed by a suitable process such as spin coating, CVD or the like. In some embodiments, the first bonding dielectric layer 320 conformally covers the isolation material 334, thus the top surface of the first bonding dielectric layer 320 is also uneven. In some embodiments, as shown in FIG. 3D, the unevenness of the top surface of the first bonding dielectric layer 320 is less than the unevenness of the top surface of the isolation material 334.

Figure 3E:
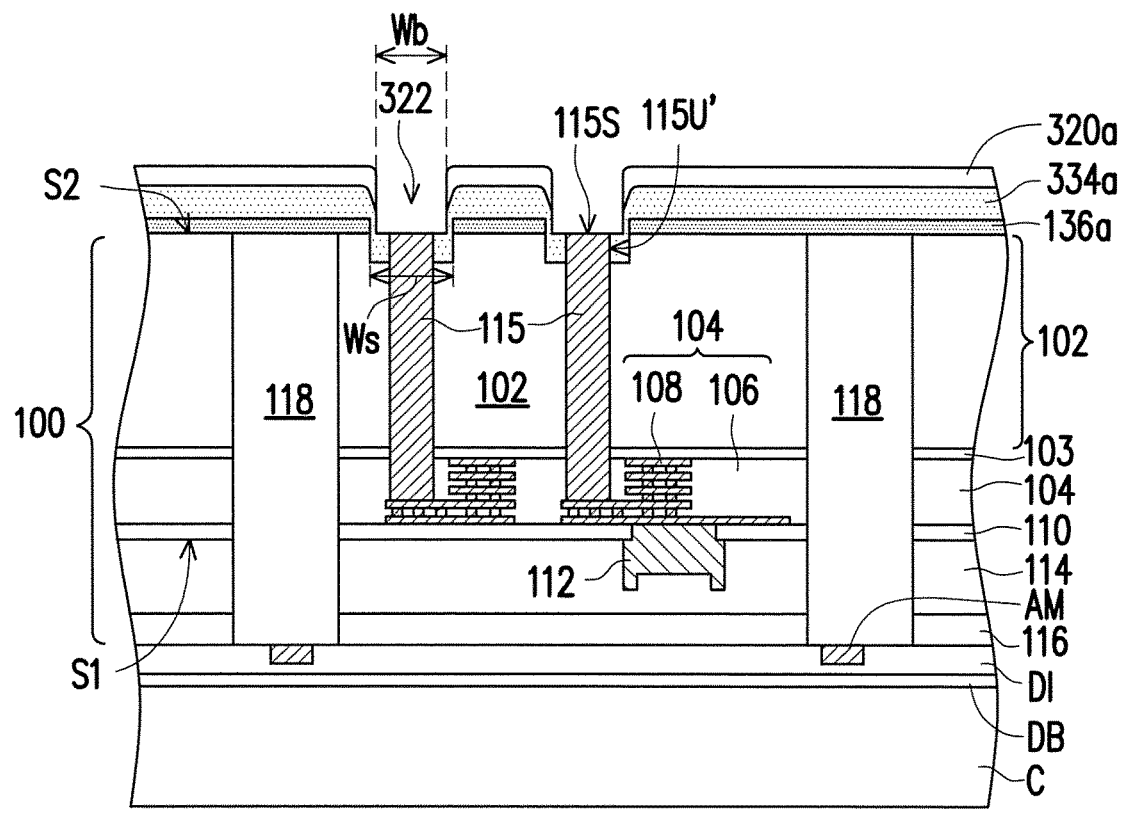

Referring to FIGS. 3D and 3E, a patterning process is performed, so that at least one opening 322 is formed in the first bonding dielectric layer 320a and the isolation structure 334a. The opening 322 exposes the top surface 115S of the first TSV 115. In some embodiments, the bottom width (or area) Wb of the opening 322 is greater than the width (or area) of the top surface 115S of the first TSV 115. Since the upper portion of the first TSV 115 is surrounded by the isolation structure 334a, even if the openings 322 is greater than the top surface 115S or is misaligned, a portion of the first substrate 102 still not be damaged or removed, so that the leakage current is accordingly decreased. In other words, the bottom width (or area) Wb of the opening 322 is less than the sum width Ws of the first TSV 115 and the isolation structure 334a aside the first TSV 115. In some embodiments, as shown in FIG. 3E, the opening 322 is not cut off the isolation structure 334a, thus the isolation structure 334a is not only disposed in the openings 322, but also extends from the upper sidewall 115U' of the first TSV 115 to a space between the etching stop layer 136a and the first bonding dielectric layer 320a. In other words, the isolation structure 334a is a continuous structure extending from the upper sidewall 115U' of the first TSV 115 to a space between the etching stop layer 136a and the first bonding dielectric layer 320a.

Figure 3F:
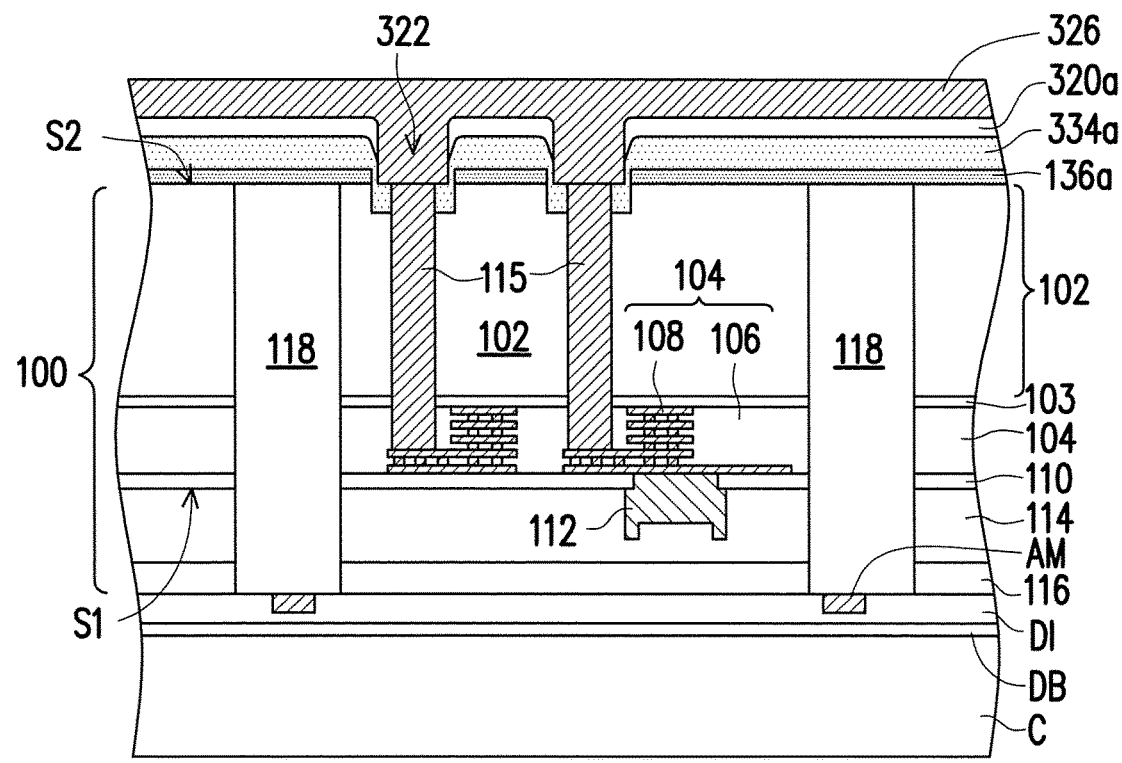
Figure 3G:
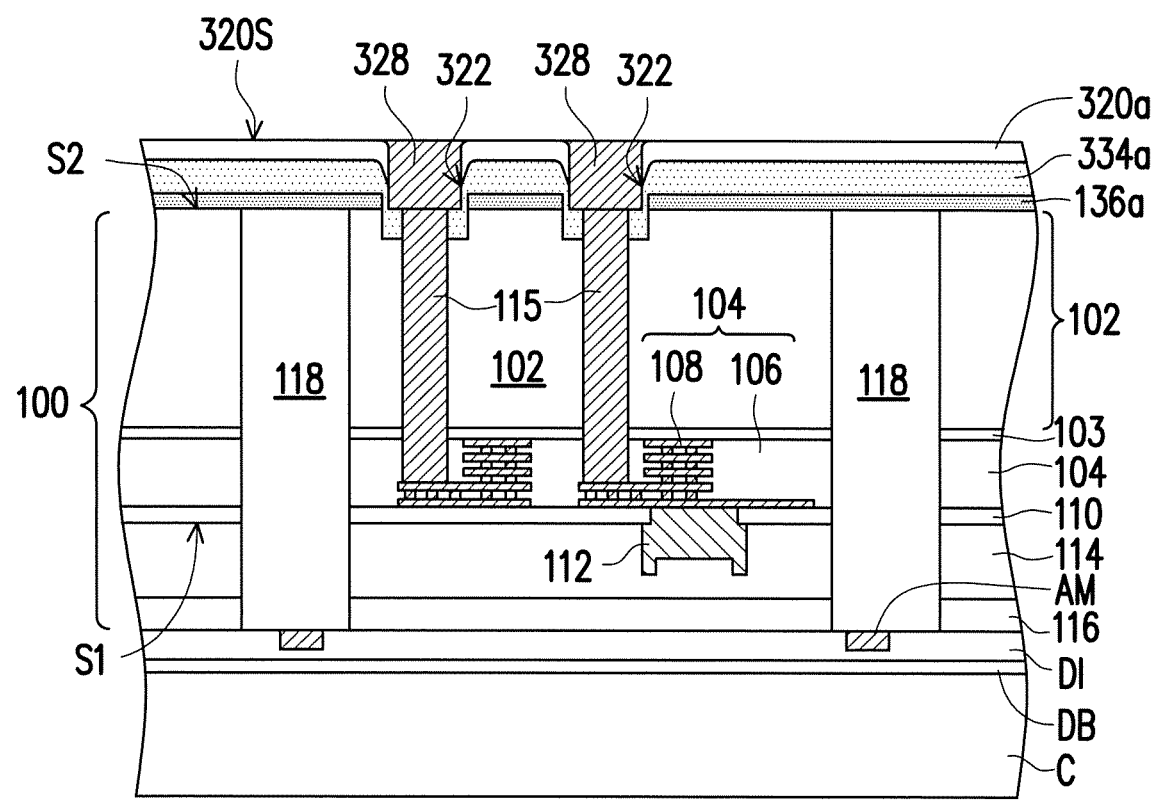

Referring to FIGS. 3F and 3G, a metal material 326 is formed over the first bonding dielectric layer 320a and filled in the opening 322. In some embodiments, the metal material 326 may be aluminum, copper, nickel, gold, silver, tungsten, or a combination thereof and formed by electrochemical plating process, CVD, PVD or the like. Thereafter, a planarization process (e.g., a CMP process) is performed to remove a portion of the metal material 326, so that the top surface 320S of the first bonding dielectric layer 320a is exposed. In the case, as shown in FIG. 3G, the first bonding metal layer 328 is formed in the first bonding dielectric layer 320a and the isolation structure 334a and is electrically connected with the first TSV 115. In some embodiments, the first bonding metal layer 328 formed in the opening 322 may be, but not limited, a cylinder or pillar with uniform width or area.

Figure 3H:
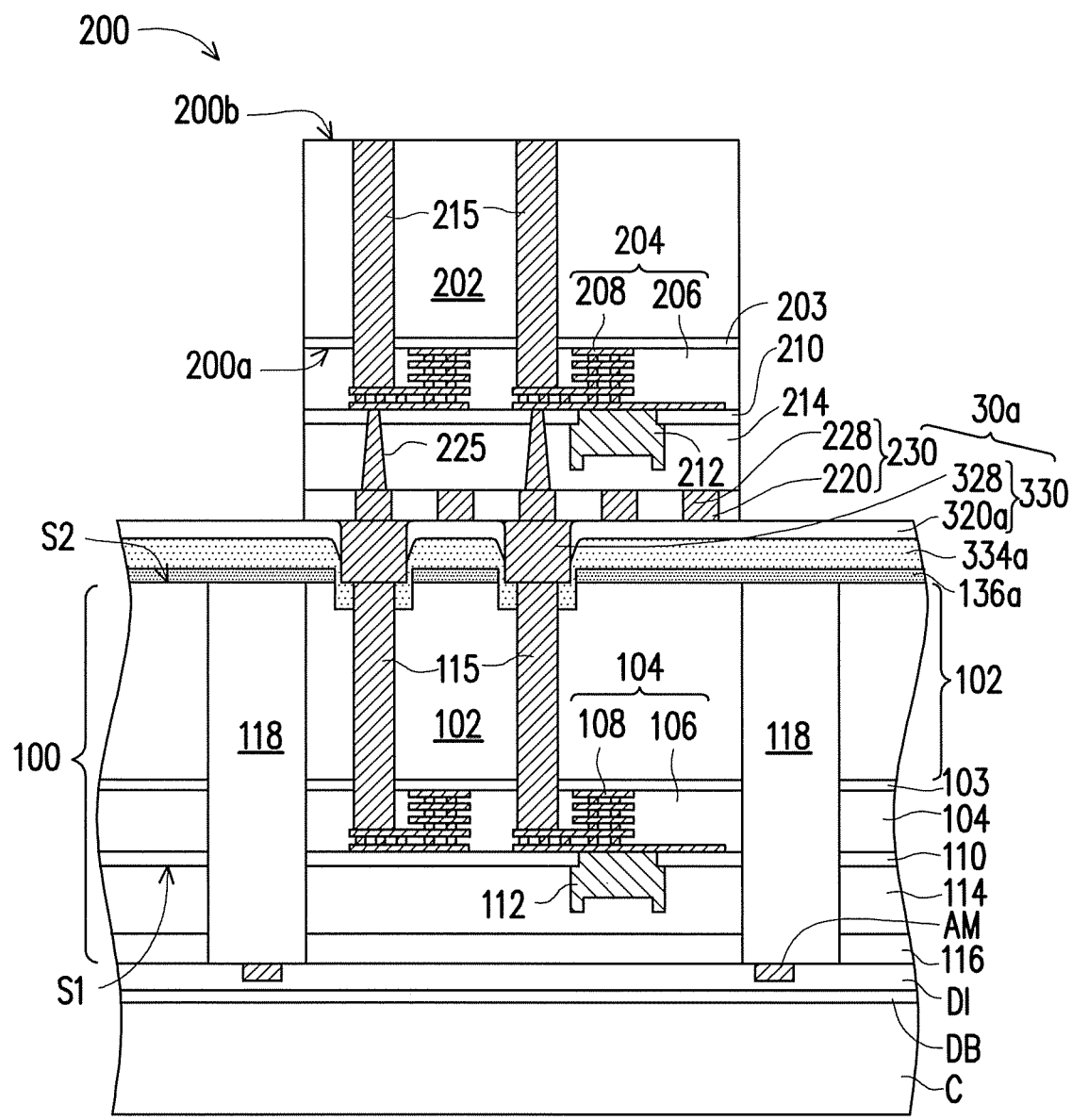

Referring to FIG. 3H, the second die 200 having the second bonding structure 230 formed over the front side 200a thereof is provided. The forming method of the second die 200 are similar to the forming method of FIG. 1G. The material and the forming method of the above elements are discussed in the foregoing. Thus, details thereof are omitted here. In some embodiments, the second die 200 is flipped, so that the front side 200a of the second die 200 faces toward the back side S2 of the first die 100. The first die 100 and the second die 200 are bonded together by a hybrid bonding to form a hybrid bonding structure 30a. The hybrid bonding structure 30a may include the first bonding structure 330 and the second bonding structure 230. As shown in FIG. 3H, a die stack structure 3 having the isolation structure 334a surrounding the upper portion of the first TSV 115 and extending to a space between the etching stop layer 136a and the first bonding dielectric layer 320a is accordingly accomplished after the first die 100 and the second die 200 are bonded together.

FIG. 4A to FIG. 4I are cross-sectional views of a method of forming a die stack structure in accordance with a fourth embodiment.

Figure 4A:
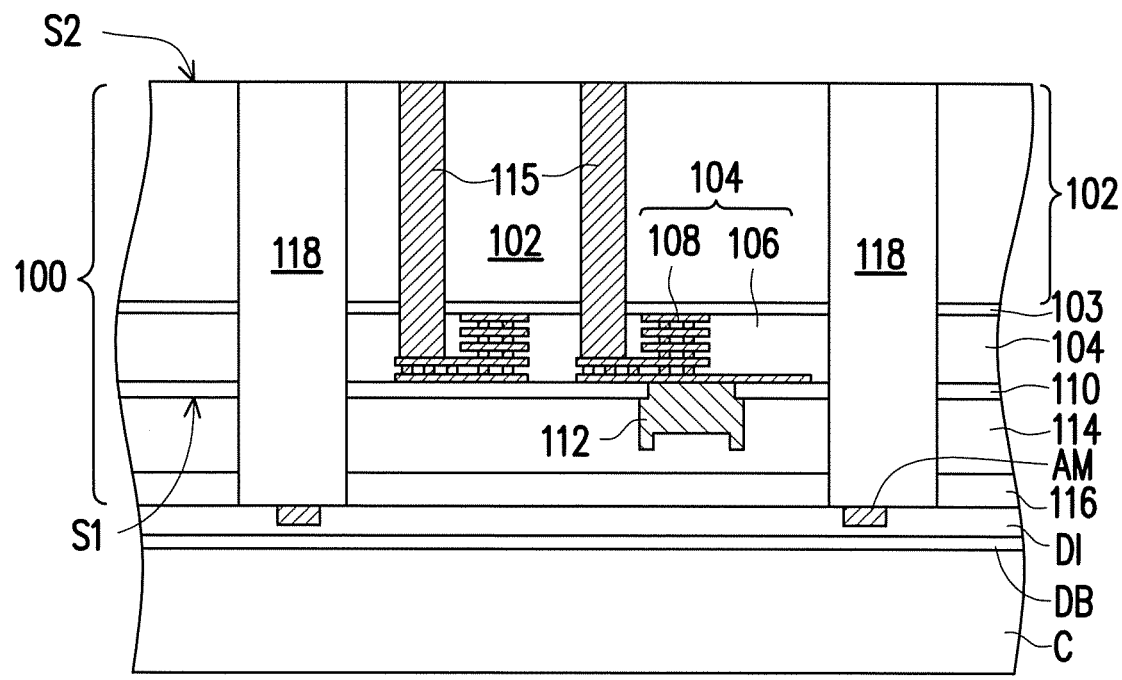
FIG. 4A to FIG. 4I are cross-sectional views of a method of forming a die stack structure in accordance with a fourth embodiment.

Referring to FIG. 4A, the structure of FIG. 4A is similar to the structure of FIG. 1B. The material and the forming method of the elements shown in FIG. 4A are discussed in the foregoing. Thus, details thereof are omitted here.

Figure 4B:
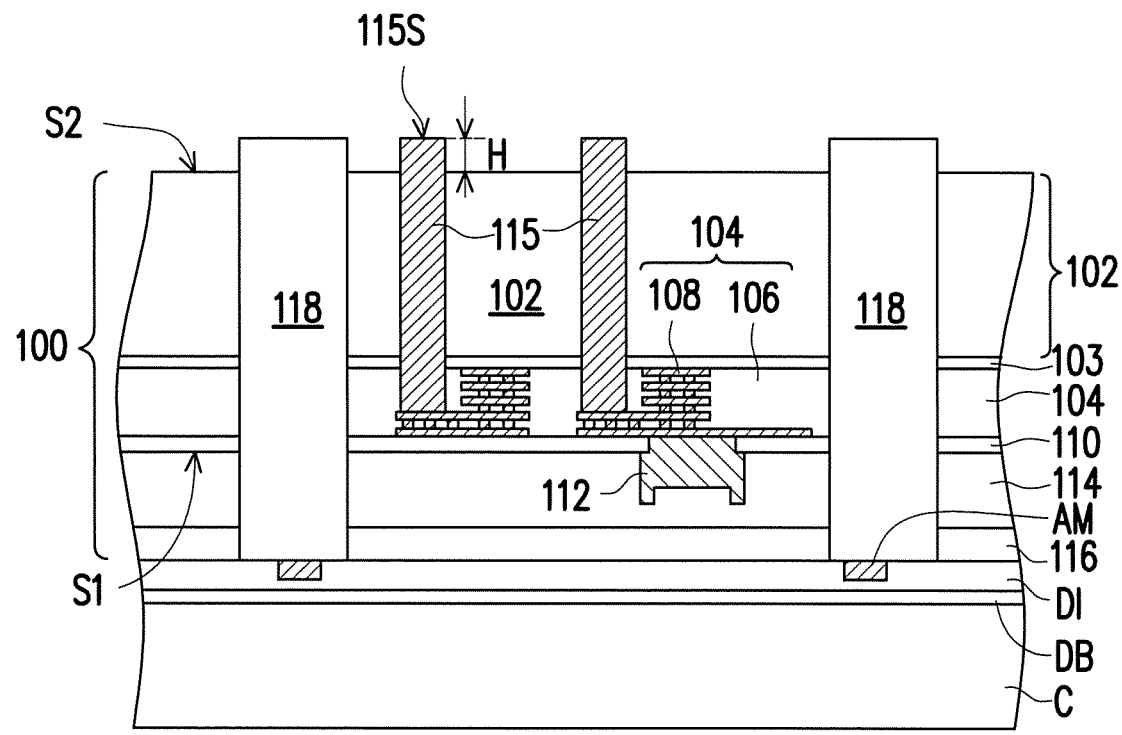

Referring to FIG. 4B, after the thinning process is performed, a portion of the first substrate 102 is blanketly removed or blanketly recessed by an etching back process, so that a height difference H exists between the back side S2 of the first substrate 102 and the top surface 115S of the first TSV 115. That is, the upper portions of the first TSV 115 and the isolation structures 118 are exposed after the etching back process is performed. In some embodiments, the height difference H between the back side S2 of the first substrate 102 and the top surface 115S of the first TSV 115 is 0.4 μm to 2 μm.

Figure 4C:
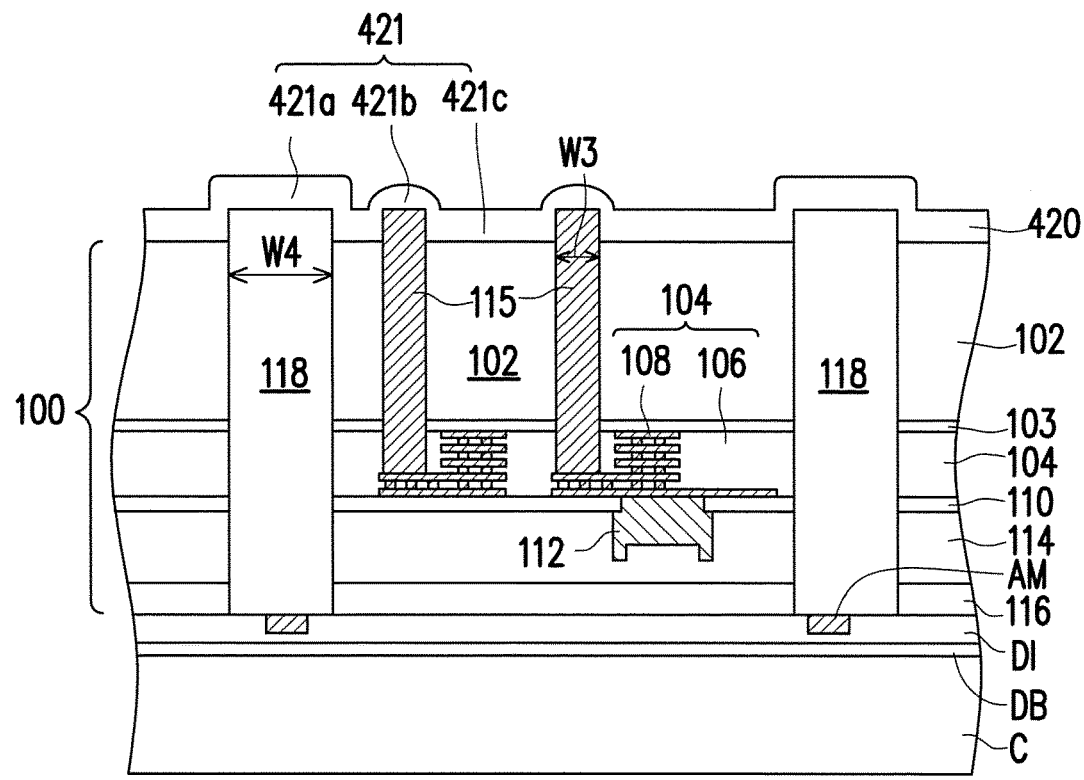
Figure 4D:
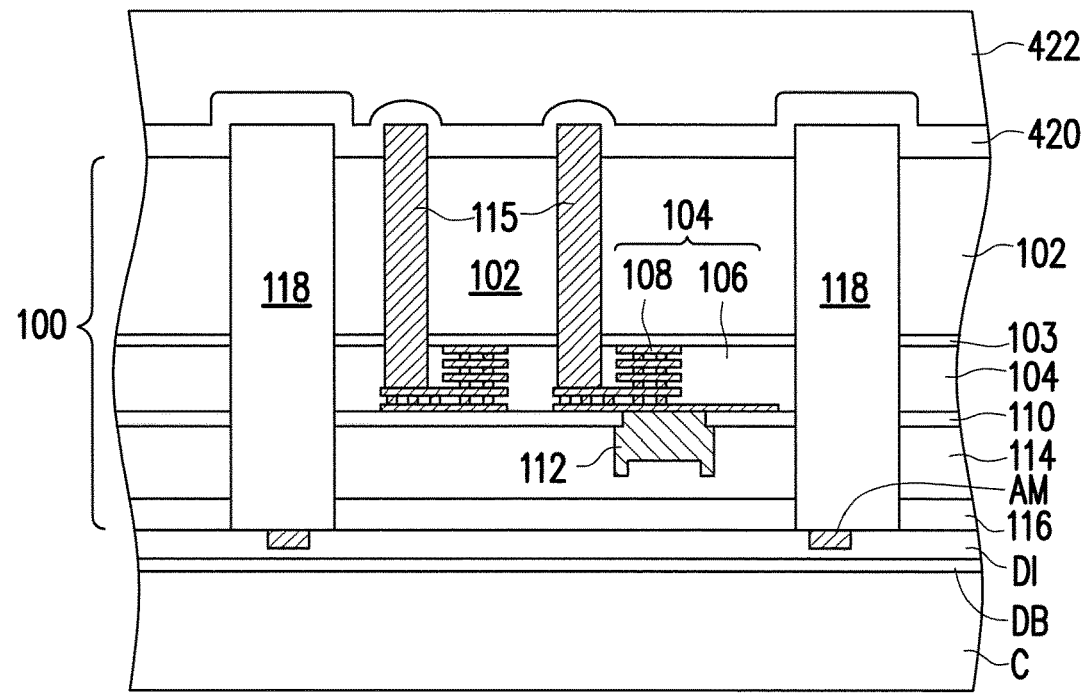

Referring to FIGS. 4C and 4D, the first bonding dielectric layer 420 is formed over the back side S2 of the first substrate 102. In some embodiments, as shown in FIG. 4C, the first bonding dielectric layer 420 conformally covers the upper portions of the first TSV 115 and the isolation structures 118. In detail, since the back side S2 of the first substrate 102 and the top surface 115S of the first TSV 115 have the height difference H, the first bonding dielectric layer 420 conformally formed thereon has a concave-convex surface. That is, the first bonding dielectric layer 420 may include an uneven structure 421. The uneven structure 421 may include a convex portion 421a, a swell portion 421b, and a flat portion 421c. The convex portion 421a corresponds to the isolation structure 118, the swell portion 421b corresponds to the first TSV 115, and the flat portion 421c corresponds to the back side S2 of the first substrate 102. In some embodiments, the width W3 of the first TSV 115 is 0.8 μm to 12 μm, and the width W4 of the isolation structure 118 is 30 μm to 1000 μm. The ratio (W4/W3) of width W4 and width W3 may be 2.5 to 1250. That is, the volume of the convex portion 421a is greater than the volume of the swell portion 421b. In other words, the volume of the first bonding dielectric layer 420 over the isolation structure 118 is greater than the volume of the first bonding dielectric layer 420 over the first TSV 115. In some embodiments, the first bonding dielectric layer 420 may include silicon oxide, silicon nitride, polymer or a combination thereof, and are formed by a suitable process such as spin coating, CVD or the like. Thereafter, the photoresist layer 422 is formed over the first bonding dielectric layer 420 by a suitable process such as spin coating.

Figure 4E:
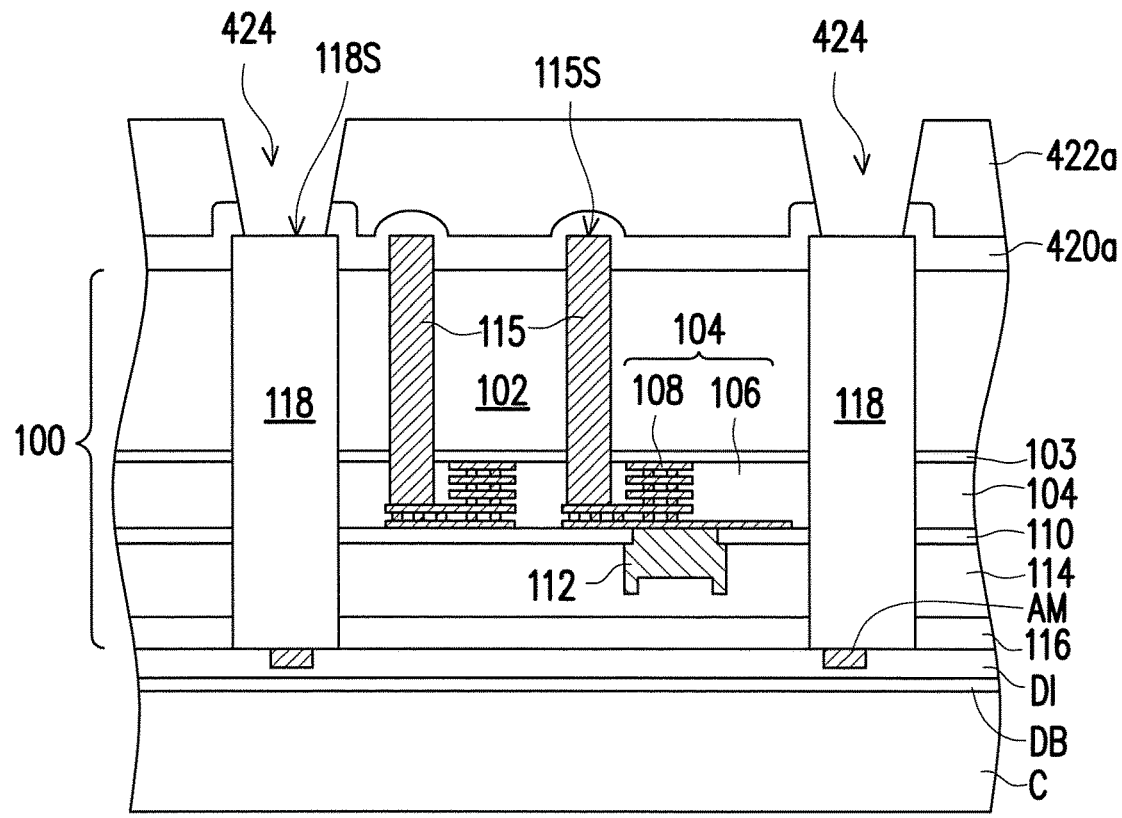
Figure 4F:
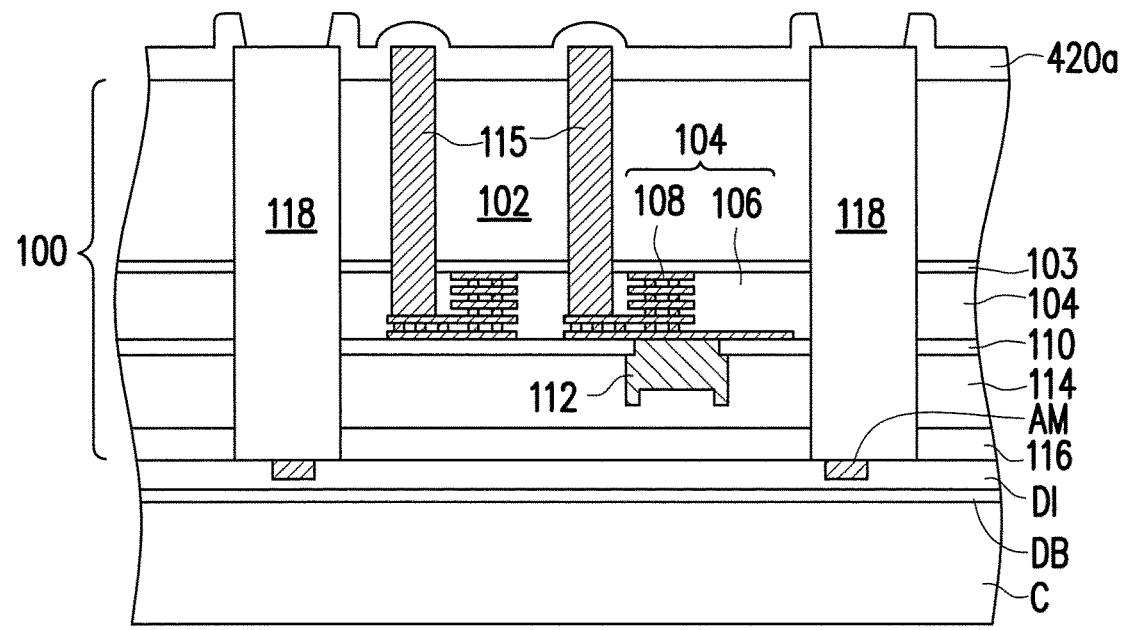

Referring to FIGS. 4D and 4E, a patterning process is performed on the photoresist layer 422 and the first bonding dielectric layer 420 to form the openings 424 over the isolation structures 118. In some embodiments, as shown in FIG. 4E, the photoresist layer 422 and the first bonding dielectric layer 420 over the isolation structures 118 are removed to form openings 424. The top surfaces 118S of the isolation structures 118 are exposed by the openings 424. In detail, the volume of the first bonding dielectric layer 420 over a plane parallel to the top surface 118S of the isolation structure 118 (or the top surface 115S of the first TSV 115) is reduced, so that the performance of the following planarization process (e.g., a CMP process) is improved. In other words, the volume of the first bonding dielectric layer 420 over the top surface 118S of the isolation structure 118 accounts for about 20-40% of the total volume of the first bonding dielectric layer 420. The openings 424 facilitate to reduce the volume of the first bonding dielectric layer 420 over the top surface 118S of the isolation structure 118 drastically, so that the performance of the following planarization process (e.g., a CMP process) is improved.

Figure 4G:
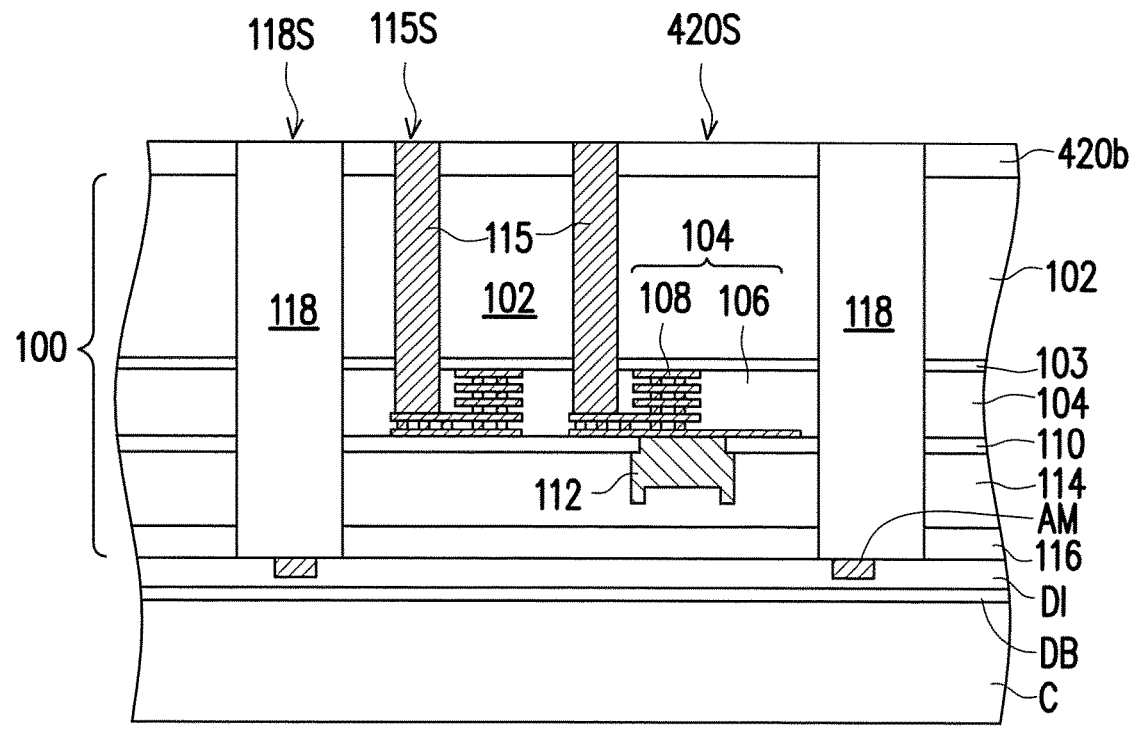

Referring to FIGS. 4E and 4G, the photoresist layer 422a is removed to expose the first bonding dielectric layer 420a. Thereafter, as shown in FIG. 4G, the planarization process (e.g., a CMP process) is performed on the first bonding dielectric layer 420a to form the first bonding dielectric layer 420b surrounding the upper portions of the first TSV 115 and the isolation structures 118. In other words, the top surfaces 118S of the isolation structures 118 and the top surface 115S of the first TSV 115 are exposed by the first bonding dielectric layer 420b.

Referring back to FIG. 4G, after the planarization process is performed, the bondable topography variation (BTV) of the top surface 420S of the first bonding dielectric layer 420b is reduced, and less than the BTV of the top surface of the first bonding dielectric layer without performing the foregoing patterning process to remove the first bonding dielectric layer 420 over the top surface 118S of the isolation structure 118. In some embodiments, the top surface 420S of the first bonding dielectric layer 420b, the top surfaces 118S of the isolation structures 118, and the top surface 115S of the first TSV 115 are coplanar after the planarization process.

Referring back to FIGS. 4G and 4H, another first bonding dielectric layer 420c (which is also referred to as a second bonding dielectric layer 420c) is formed over the first bonding dielectric layer 420b. In some embodiments, the material of first bonding dielectric layer 420c is the same as the material of the first bonding dielectric layer 420b. In some other embodiments, the material of first bonding dielectric layer 420c is differ from the material of the first bonding dielectric layer 420b. The first bonding dielectric layer 420c is patterned by lithography and etching processes to form openings therein. In some embodiments in which the material of the first bonding dielectric layer 420b is differ from the material of the first bonding dielectric layer 420c, during the etching process, the first bonding dielectric layer 420b serves as an etching stop layer, and thus the first bonding dielectric layer 420b is exposed by the openings when the lithography process is misaligned. The first bonding metal layer 428 is then formed in the openings in the first bonding dielectric layer 420c to be electrically connected to the first TSV 115. In some embodiments, the first bonding dielectric layer 420b, 420c and the first bonding metal layer 428 are referred as the first bonding structure 430.

Figure 4H:
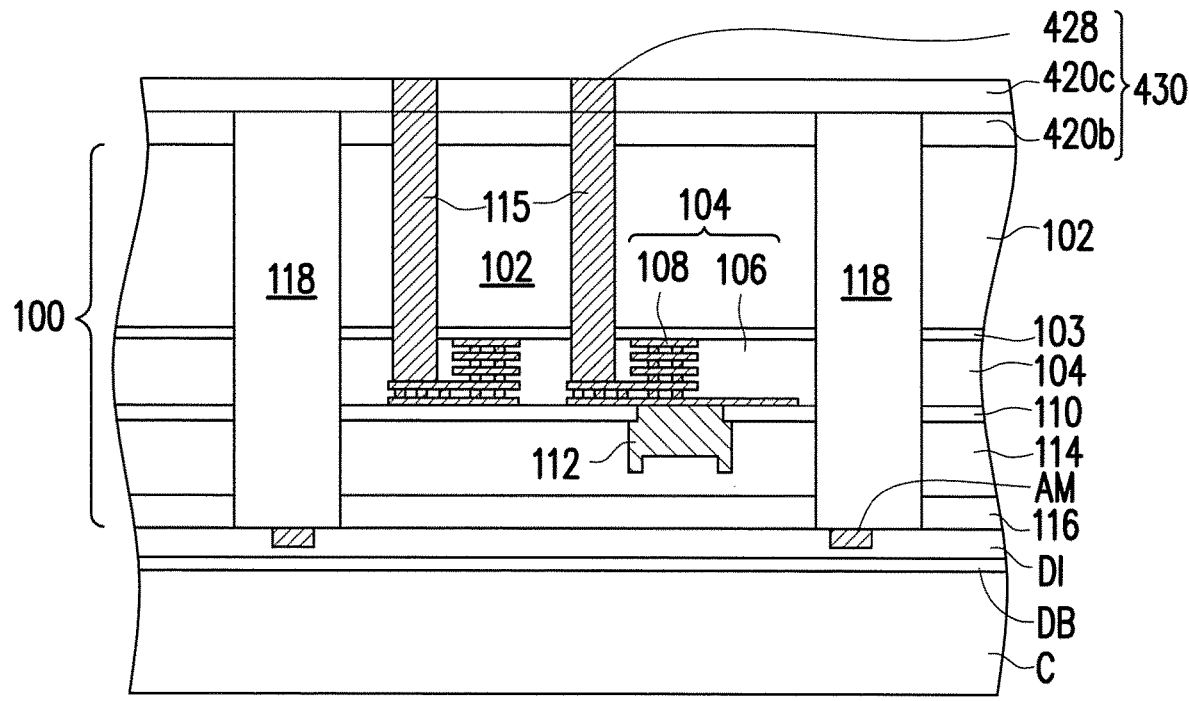
Figure 4I:
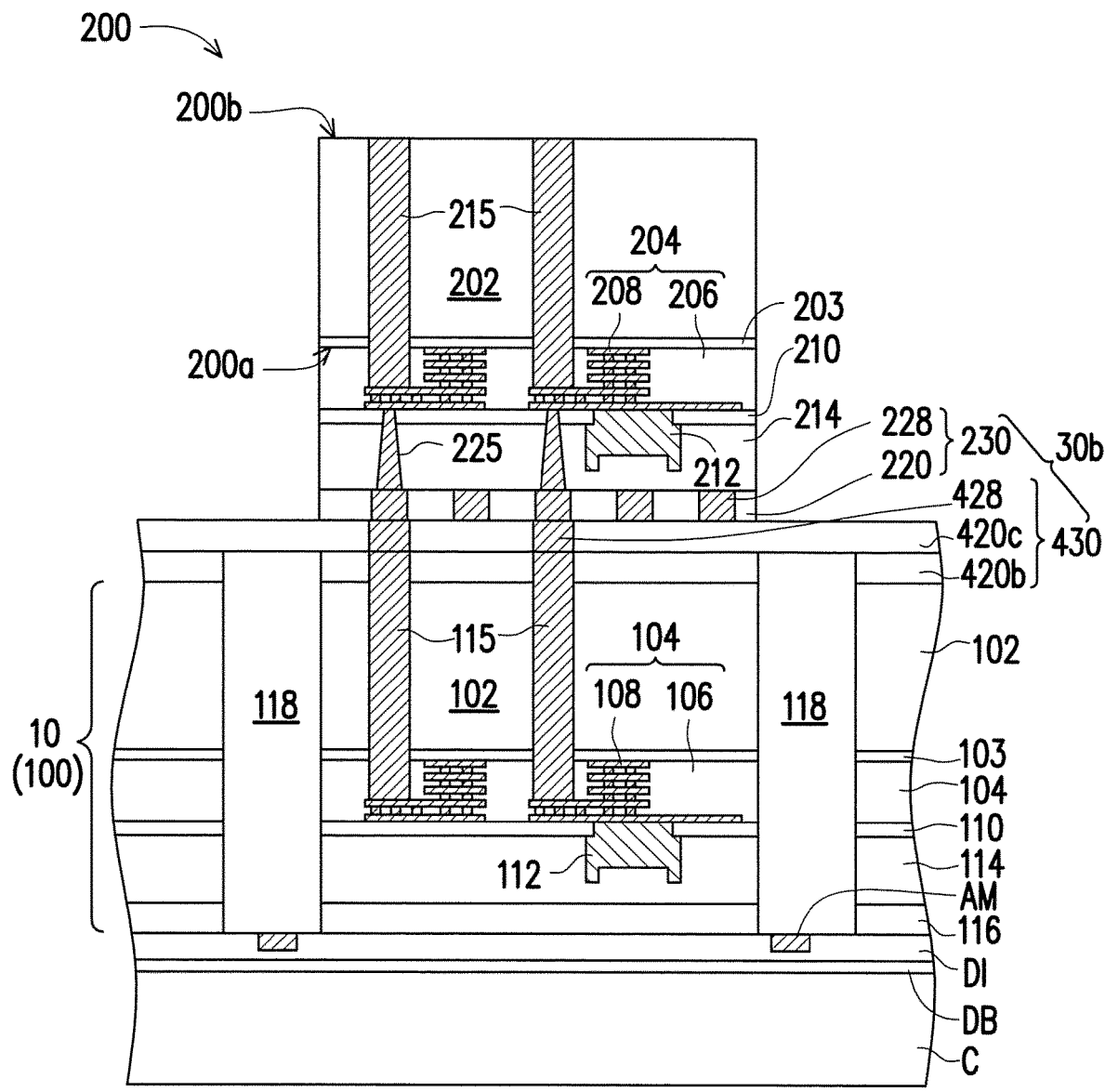

Referring to FIGS. 4H and 4I, the second die 200 having the second bonding structure 230 formed over the front side 200a thereof is provided. The first die 100 and the second die 200 are bonded together by a hybrid bonding to form a hybrid bonding structure 30b. The hybrid bonding structure 30b may include the first bonding structure 430 and the second bonding structure 230. In detail, the second bonding metal layer 228 and the first bonding metal layer 428 are bonded by metal-to-metal bonding, while the second bonding dielectric layer 220 and the first bonding dielectric layer 420c are bonded by non-metal-to-non-metal bonding. In some embodiments, as shown in FIG. 4I, a die stack structure 4 having the first bonding dielectric layer 420b surrounding the upper portion of the first TSV 115 is accordingly accomplished after the first die 100 and the second die 200 are bonded together.

Figure 5:
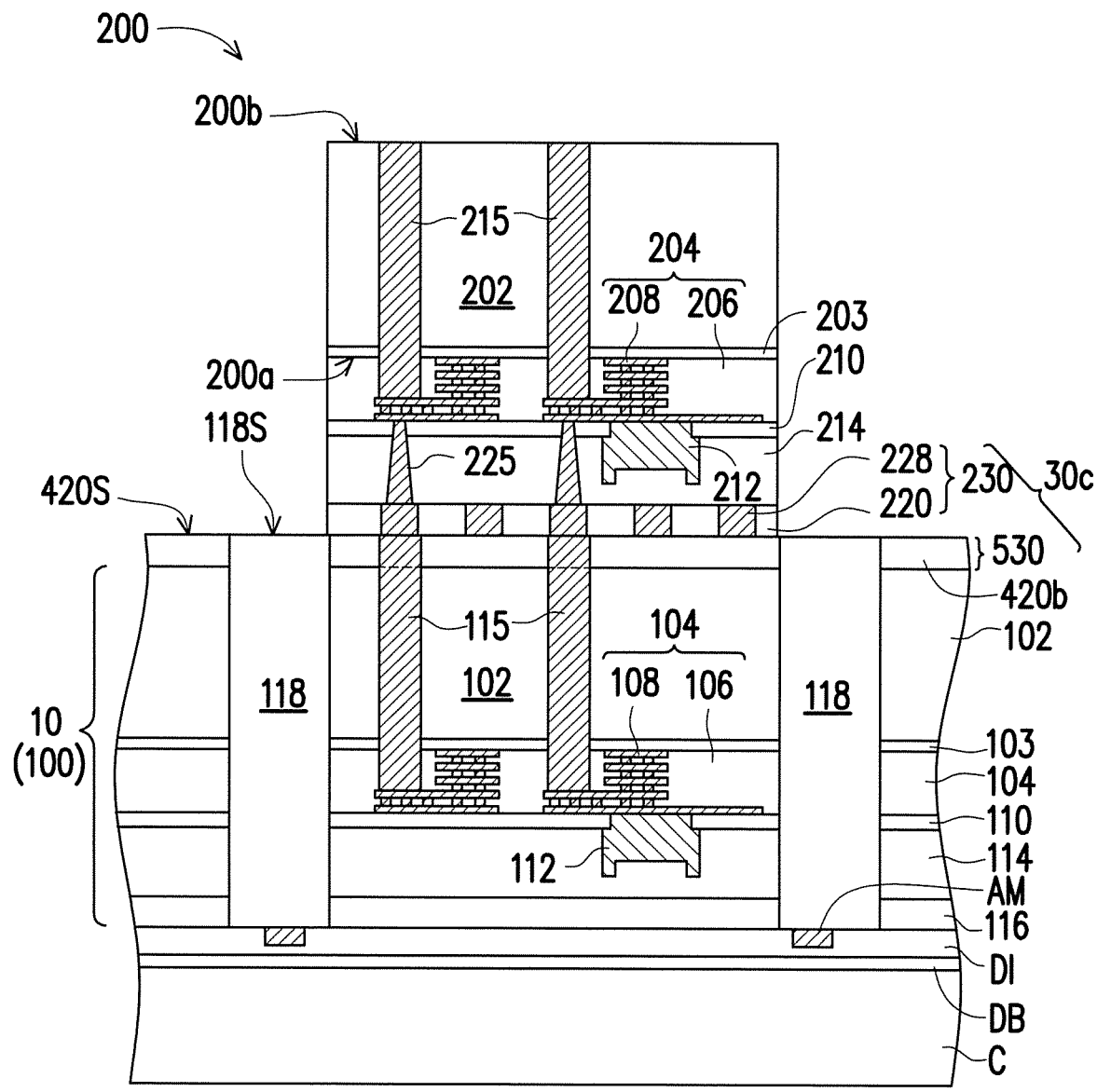
FIG. 5 is a cross-sectional view of a die stack structure in accordance with fifth embodiment.

FIG. 5 is a cross-sectional view of a die stack structure in accordance with fifth embodiment.

Referring to FIGS. 4G and 5, in some embodiments, the top surface 420S of the first bonding dielectric layer 420b, the top surfaces 118S of the isolation structures 118, and the top surface 115S of the first TSV 115 are coplanar after the planarization process, and the BTV of the top surface 420S of the first bonding dielectric layer 420b may be less than 1 μm per 1 mm range to ease to directly bond to other dies or chips.

For example, as shown in FIG. 5, the second die 200 having the second bonding structure 230 formed over the front side 200a thereof is provided. The first die 100 and the second die 200 are bonded together by a hybrid bonding to form a hybrid bonding structure 30c. The hybrid bonding structure 30c may include the first bonding structure 530 (including the first bonding dielectric layer 420b and the upper portion of the first TSV 115 surrounded by the first bonding dielectric layer 420b) and the second bonding structure 230. In detail, the second bonding metal layer 228 and the first TSV 115 are bonded by metal-to-metal bonding, while the second bonding dielectric layer 220 and the first bonding dielectric layer 420b are bonded by non-metal-to-non-metal bonding. In some embodiments, as shown in FIG. 5, a die stack structure 5 having the first bonding dielectric layer 420b surrounding the upper portion of the first TSV 115 is accordingly accomplished after the first die 100 and the second die 200 are bonded together.

Figure 7:
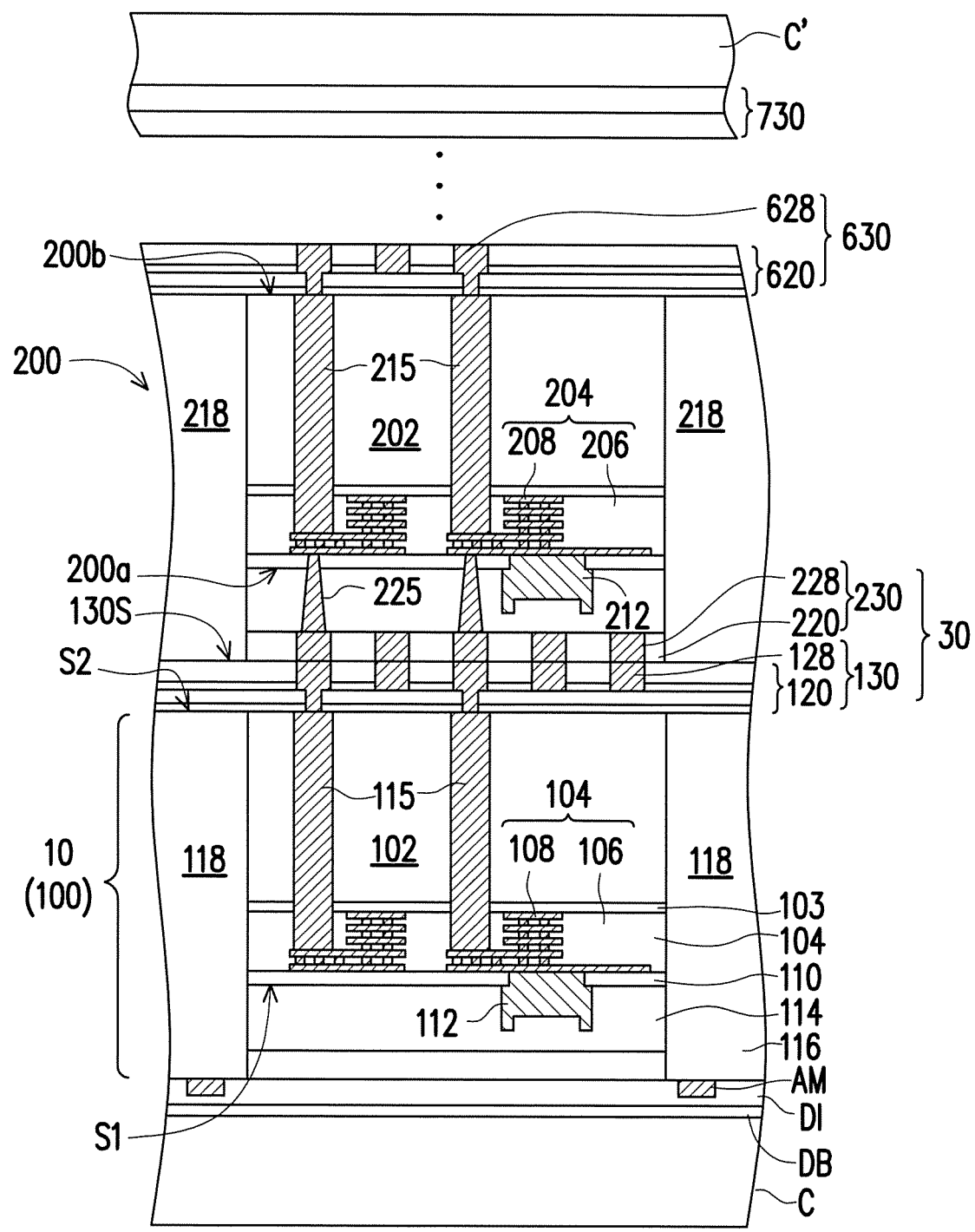
FIG. 7 is a cross-sectional view of a die stack structure in accordance with sixth embodiment.

Referring to FIG. 7, the arrangement, material and forming method of the die stack structure 7 are similar to the arrangement, material and forming method of die stack structure 1. Thus, details thereof are omitted here. A difference therebetween lies in that more than two dies are back-to-face bonded together in the die stack structure 7. In detail, the die stack structure 7 includes one of the first dies 100 separated by the isolation structures 118, and one of the second dies 200 separated by the isolation structures 218 bonded together by the hybrid bonding structure 30. Thereafter, a bonding structure 630 is formed over the back side 200b of the second die 200. The bonding structure 630 may include the bonding dielectric layer 620 and the bonding metal layer 628 formed in the bonding dielectric layer 620. The bonding metal layer 628 is electrically connected with the second TSV 215. Similarly, the second dies 20 may be bonded with another die by the bonding structure 630. As shown in FIG. 7, the topmost die (not shown) and another carrier C' are bonded together by the bonding structure 730.

Figure 6:
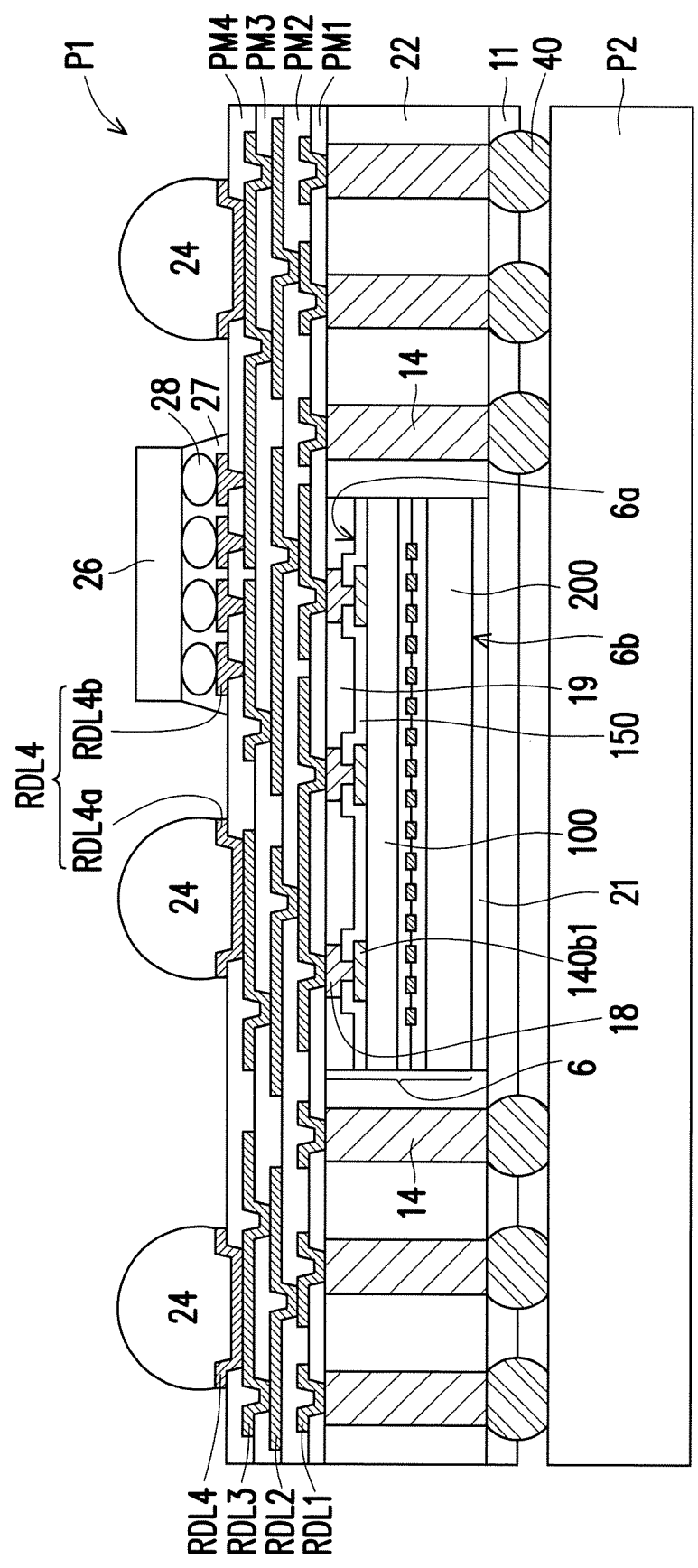
FIG. 6 is a cross-sectional view of a package in accordance with one embodiment.

FIG. 6 is a cross-sectional view of a package in accordance with one embodiment.

Referring to FIG. 6, a package P1 including a die stack structure 6, an insulating encapsulation 22, and a redistribution layer structure 23 is provided. In detail, the die stack structure 6 having a first surface 6a and a second surface 6b opposite to each other is mounted over a dielectric layer 11 by an adhesive layer 21. The first surface 6a of the die stack structure 6 is toward upward, and the second surface 6b of the die stack structure 6 is toward the dielectric layer 11. In some embodiments, the die stack structure 6 may be one of the die stack structure 1, 2, 3, 4, and 5 which the first die 100 and the second die 200 are back-to-face bonded together. That is, the front side (e.g., the active surface) of the second die 200 faces forward the back side of the first die 100. The first die 100 and the second die 200 may have the same function or different functions. In some embodiments, the number of the first die 100 or the second die 200 is not limited by the disclosure. In other words, a plurality of dies or chips may be back-to-face bonded together to form the die stack structure. For example, as shown in FIG. 7, more than two dies are back-to-face bonded together in the die stack structure 7. In some alternative embodiments, the number of the die stack structure 6 is not limited by the disclosure. For example, a plurality of die stack structures (not shown) are arranged in parallel in the insulating encapsulation 22.

Referring to FIG. 6, the die stack structure 6 further includes a plurality of connectors 18 and a passivation layer 19. The connectors 18 are formed over and electrically connected to the bonding pads 140b1 not covered by the passivation layer 150. The connector 18 includes solder bumps, gold bumps, copper bumps, copper posts, copper pillars, or the like. The passivation layer 19 is formed over the passivation layer 150 and aside the connectors 18 to cover the sidewalls of the connectors 18. Take the die stack structure 7 for example, as shown in FIG. 7, the die stack structure 7 is upside down, so that the front side S1 of the first die 100 faces upward. In some embodiments, the dielectric layer DI may be de-bonded from the de-bonding layer DB, such that the dielectric layer DI is separated or delaminated from the de-bonding layer DB and the carrier C. In some embodiments, the de-bonding layer DB (e.g., the LTHC release layer) may be irradiated by an UV laser such that the dielectric layer DI is peeled from the carrier C. In some alternative embodiments, the dielectric layer DI may be separated from the first die 100, such that the dielectric layer 116 is exposed. Thereafter, a connector (e.g., the connector 18, such as μ-bump) may be formed over the first pad 112 (e.g., the bonding pads 140b1) by a patterning process and a deposition, as shown in FIG. 6.

Referring to FIG. 6, the insulating encapsulation 22 is formed aside the die stack structure 6 to encapsulate the die stack structure 6. A plurality of conductive posts 14 are formed in the insulating encapsulation 22 and surround the die stack structure 6. A redistribution layer (RDL) structure 23 is formed over and electrically connected to the die stack structure 6 and the conductive posts 14. In some embodiments, the RDL structure 23 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

In other words, the redistribution layer RDL1 penetrates through the polymer layer PM1 and is electrically connected to the connectors 18 of the die stack structure 6 and the conductive posts 14. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials include metal such as copper, nickel, titanium, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL1, RDL3 and RDL 4 respectively includes a plurality of vias and a plurality of traces connected to each other. The vias connects the redistribution layers RDL1, RDL1, RDL3 and RDL 4, and the traces are respectively located on the polymer layers PM1, PM2, PM3 and PM4, and are respectively extending on the top surface of the polymer layers PM1, PM2, PM3 and PM4.

In some embodiments, the topmost redistribution layer RDL4 includes RDL4a and RDL4b. The redistribution layer RDL4a is also referred as under-ball metallurgy (UBM) layer for ball mounting. The redistribution layer RDL4b may be micro bump for connecting to an integrated passive device (IPD) 26 formed in the subsequent process.

Thereafter, a plurality of connectors 24 are formed over and electrically connected to the redistribution layer RDL4a of the redistribution layer structure 23. In some embodiments, the connectors 24 are made of a conductive material with low resistivity, such as Sn, Pb, Ag, Cu, Ni, Bi or an alloy thereof, and are formed by a suitable process such as evaporation, plating, ball drop, or screen printing. An IPD 26 is formed over and electrically connected to the redistribution layer RDL4b of the redistribution layer structure 23 through the solder bumps 28. The IPD 26 may be a capacitor, a resistor, an inductor or the like, or a combination thereof. The number of the IPD 26 is not limited to that is shown in FIG. 6, but may be adjusted according to the design of the product. An underfill layer 27 is formed between the IPD 26 and the polymer layer PM4, and surrounds and covers the exposed RDL4b, the solder bumps 28 and the bottom surface of the IPD 26.

As shown in FIG. 6, the dielectric layer 11 is then patterned such that lower surfaces of the conductive posts 14 is exposed by the dielectric layer 11. After the conductive terminals 40 are formed over the lower surfaces of the conductive posts 14 respectively, an integrated fan-out package P1 having dual-side terminals is accomplished. Another package P2 is then provided. In some embodiments, the package P2 is, for example, a memory device. The package P2 is stacked over and is electrically connected to the integrated fan-out package P1 through the conductive terminals 40 such that a package-on-package (POP) structure is fabricated.

According to some embodiments, a die stack structure includes a first die, a second die, a first bonding structure, and a second bonding structure. The first bonding structure is disposed over a back side of the first die. The second bonding structure is disposed over a front side of the second die. The first die and the second die are bonded together via the first bonding structure and the second bonding structure and a bondable topography variation of a surface of the first bonding structure bonding with the second bonding structure is less than 1 µm per 1 mm range.

According to some embodiments, a method of manufacturing a die stack structure includes providing a first die having at least one first through-substrate via (TSV) therein; performing a thinning process on a back side of the first die to expose the first TSV; directly forming a first bonding structure over the back side of the first die after the thinning process; forming a second bonding structure over a front side of a second die; and bonding the first die and the second die together via the first bonding structure and the second bonding structure.

According to some embodiments, a method of manufacturing a die stack structure includes providing a first die having a first substrate, a first interconnect disposed over a front side of the first substrate, and at least one first through-substrate via (TSV) in the first substrate; recessing a back side of the first substrate to form a recess aside the first TSV, wherein the recess surrounds the first TSV and exposes an upper sidewall of the first TSV; forming an isolation structure in the recess; forming a first bonding dielectric layer over the isolation structure; forming a first bonding metal layer in the first bonding dielectric layer to form a first bonding structure over the back side of the first substrate; forming a second bonding structure over a front side of a second die; and bonding the first die and the second die together via the first bonding structure and the second bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stack structure, comprising:
a first die and a second die bonded together via a first bonding structure and a second bonding structure, wherein
the first bonding structure is disposed on a non-active surface of the first die, and the first bonding structure comprises a first bonding dielectric layer and a first bonding metal layer disposed in the first bonding dielectric layer,
the second bonding structure is disposed on an active surface of the second die, and the second bonding structure comprises a second bonding dielectric layer and a second bonding metal layer disposed in the second bonding dielectric layer,
the first bonding dielectric layer is in physical contact with the second bonding dielectric layer, and the first bonding metal layer is in physical contact with the second bonding metal layer, and
a bondable topography variation of a surface of the first bonding structure bonding with the second bonding structure is less than 1 µm per 1 mm range.

2. The die stack structure of claim 1, wherein the first die comprises:
a first substrate;
a first interconnect, disposed over a front side of the first substrate; and
at least one first through-substrate via (TSV), penetrating through the first substrate to electrically connect to the first interconnect and the first bonding structure.

3. The die stack structure of claim 2, wherein the first bonding structure comprises:
the first bonding dielectric layer, disposed over the first TSV and a back side of the first substrate; and
the first bonding metal layer, electrically connected with the first TSV and the second bonding metal layer.

4. The die stack structure of claim 3, wherein the first bonding metal layer comprises a single damascene structure, a dual damascene structure or a combination thereof.

5. The die stack structure of claim 4, wherein the single damascene structure comprises a bump metal line, and the dual damascene structure comprises a bump via and another bump metal line over the bump via.

6. The die stack structure of claim 3, when the first bonding metal layer is a dual damascene structure, a bottom area of the first bonding metal layer is less than a top area of the first TSV.

7. The die stack structure of claim 3, further comprising an isolation structure surrounding an upper portion of the first TSV to electrically isolate the first bonding metal layer and the first substrate.

8. The die stack structure of claim 7, wherein the isolation structure extends from an upper sidewall of the first TSV to a space between the first substrate and the first bonding dielectric layer.

9. The die stack structure of claim 2, wherein the first bonding dielectric layer comprises a first portion disposed over a back side of the first substrate and surrounding an upper portion of the first TSV, so that a top surface of the first TSV are exposed by the first portion.

10. The die stack structure of claim 9, wherein the first bonding dielectric layer further comprises a second portion disposed over the first portion and being in physical contact with the second bonding dielectric layer,
   wherein the first bonding metal layer is disposed in the second portion to be electrically connected with the first TSV and the second bonding metal layer.

11. A die stack structure, comprising:
   a first die comprising at least one first through-substrate via (TSV);
   a second die having an active surface toward and bonded to a non-active surface of the first die via a hybrid bonding structure, wherein the hybrid bonding structure comprises a first bonding metal layer in physical contact with a second bonding metal layer, and a first bonding dielectric layer in physical contact with a second bonding dielectric layer,
   wherein a contact interface between the first bonding metal layer and the second bonding metal layer is level with a contact interface between the first bonding dielectric layer and the second bonding dielectric layer;
   wherein the hybrid bonding structure comprises a first bonding structure and a second bonding structure bonded together, and a bondable topography variation of a surface of the first bonding structure bonding with the second bonding structure is less than 1 µm per 1 mm range; and
   an isolation structure surrounding an upper portion of the first TSV.

12. The die stack structure of claim 11, wherein the hybrid bonding structure comprises a first bonding structure and a second bonding structure bonded together, and the first bonding structure comprises:
   the first bonding dielectric layer, disposed over the first TSV and a back side of a first substrate of the first die; and
   the first bonding metal layer, electrically connected with the first TSV and the second bonding metal layer.

13. The die stack structure of claim 12, wherein the isolation structure extends from an upper sidewall of the first TSV to a space between the first substrate and the first bonding dielectric layer.

14. The die stack structure of claim 11, wherein the isolation material comprises a dielectric material, and the dielectric material comprises silicon oxide, silicon nitride, silicon oxynitride, or a combination thereof.

15. A package, comprising:
   a die stack structure, comprising a first die and a second die bonded together via a first bonding structure and a second bonding structure, wherein
      the first bonding structure is disposed on a non-active surface of the first die, and the first bonding structure comprises a first bonding dielectric layer and a first bonding metal layer disposed in the first bonding dielectric layer,
      the second bonding structure is disposed on an active surface of the second die, and the second bonding structure comprises a second bonding dielectric layer and a second bonding metal layer disposed in the second bonding dielectric layer,
      the first bonding dielectric layer is in physical contact with the second bonding dielectric layer, and the first bonding metal layer is in physical contact with the second bonding metal layer, and
      a bondable topography variation of a surface of the first bonding structure bonding with the second bonding structure is less than 1 µm per 1 mm range;
   an insulating encapsulation, encapsulating the die stack structure; and
   a redistribution layer (RDL) structure, disposed over the die stack structure and the insulating encapsulation.

16. The package of claim 15, wherein the die stack structure comprises a plurality of die stack structures arranged in parallel in the insulating encapsulation.

17. The package of claim 15, wherein the first die comprises:
   a first substrate;
   a first interconnect, disposed over a front side of the first substrate; and
   at least one first through-substrate via (TSV), penetrating through the first substrate to electrically connect to the first interconnect and the first bonding structure.

18. The package of claim 17, further comprising an isolation structure surrounding an upper portion of the first TSV in the first substrate.

19. The package of claim 17, wherein the first bonding dielectric layer comprises:
   a first portion-disposed over a back side of the first substrate and surrounding an upper portion of the first TSV, so that a top surface of the first TSV are exposed by the first portion; and
   a second portion disposed over the first portion and being in physical contact with the second bonding dielectric layer.

* * * * *